United States Patent
Woo et al.

(10) Patent No.: US 11,569,836 B2
(45) Date of Patent: Jan. 31, 2023

(54) MULTI-LEVEL SIGNAL GENERATOR AND MEMORY DEVICE INCLUDING THE SAME

(71) Applicant: Samsung Electronics Co., Ltd., Suwon-si (KR)

(72) Inventors: Byungsuk Woo, Hwaseong-si (KR); Younguk Chang, Suwon-si (KR); Yongho Cho, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/346,220

(22) Filed: Jun. 12, 2021

(65) Prior Publication Data

US 2022/0123759 A1   Apr. 21, 2022

(30) Foreign Application Priority Data

Oct. 16, 2020   (KR) .................. 10-2020-0133850

(51) Int. Cl.
*H03M 1/66* (2006.01)
*H03M 1/12* (2006.01)

(52) U.S. Cl.
CPC ........... *H03M 1/126* (2013.01); *H03M 1/662* (2013.01)

(58) Field of Classification Search
CPC .......... H03M 1/66; H03M 1/68; H03M 1/682; H03M 1/002; H03M 1/662; H03M 1/687; H03M 1/08; H03M 1/1061; H03M 3/50; H03M 1/0665; H03M 1/1057; H03M 1/661; H03M 1/664; H03M 3/38; H03M 7/3011; H03M 1/0607
USPC .................................................. 341/144, 145
See application file for complete search history.

(56) References Cited

U.S. PATENT DOCUMENTS

| | | | |
|---|---|---|---|
| 6,438,012 B1 | 8/2002 | Osaka et al. | |
| 6,489,905 B1* | 12/2002 | Lee | H03M 1/1057 341/145 |
| 7,262,725 B2* | 8/2007 | Huang | H03M 7/3011 341/145 |
| 7,439,898 B1* | 10/2008 | Nittala | H03M 1/462 341/163 |
| 7,456,773 B1* | 11/2008 | Seo | H03M 1/002 341/145 |

(Continued)

FOREIGN PATENT DOCUMENTS

| | | |
|---|---|---|
| JP | 3543336 B2 | 7/2004 |
| JP | 2020016953 A | 1/2020 |

*Primary Examiner* — Linh V Nguyen
(74) *Attorney, Agent, or Firm* — Muir Patent Law, PLLC

(57) ABSTRACT

A multi-level signal generator includes a receiving circuit, a setting circuit, a data bit generating circuit and a digital-to-analog converter. The receiving circuit generates a first data bit based on an input data signal having two voltage levels that are different from each other. The setting circuit generates a flag signal based on a command signal. The flag signal is changed depending on an operation mode. The data bit generating circuit generates a plurality of internal bits based on the first data bit, selects at least one of the plurality of internal bits based on the flag signal, and outputs the selected internal bit as at least one additional data bit. The digital-to-analog converter generates an output data signal that is a multi-level signal having three or more voltage levels different from each other based on the first data bit and the at least one additional data bit.

20 Claims, 16 Drawing Sheets

(56) References Cited

U.S. PATENT DOCUMENTS

| | | | |
|---|---|---|---|
| 7,535,389 B1* | 5/2009 | Teterwak | H03M 1/1052 |
| | | | 341/118 |
| 7,659,841 B1* | 2/2010 | Newell | H03M 7/3011 |
| | | | 341/120 |
| 7,928,881 B1* | 4/2011 | Baek | H03M 1/682 |
| | | | 327/107 |
| 9,337,860 B1* | 5/2016 | Li | H03M 1/0692 |
| 9,755,792 B1* | 9/2017 | Lin | G06F 7/582 |
| 9,941,897 B1* | 4/2018 | Li | H03M 1/201 |
| 10,164,817 B2 | 12/2018 | Hollis et al. | |
| 10,536,310 B2 | 1/2020 | Iwai | |
| 10,541,010 B2 | 1/2020 | Hollis | |
| 10,686,634 B2 | 6/2020 | Hollis et al. | |
| 2003/0097501 A1* | 5/2003 | Young | H04R 3/00 |
| | | | 710/69 |
| 2012/0194373 A1* | 8/2012 | Steinbach | H03M 1/661 |
| | | | 341/144 |
| 2016/0134302 A1* | 5/2016 | Schafferer | H03F 1/3247 |
| | | | 341/120 |
| 2019/0102330 A1 | 4/2019 | Hasbun et al. | |
| 2020/0185049 A1 | 6/2020 | Spirkl et al. | |

\* cited by examiner

| INTERNAL DATA | | TEST MODE | EXTERNAL DATA | FLAG |
|---|---|---|---|---|
| LEVEL | MSB/LSB | | | |
| VL14 | 11 | NON_INV | 1 | 0 |
| VL13 | 10 | INV | 1 | 1 |
| VL12 | 01 | INV | 0 | 1 |
| VL11 | 00 | NON_INV | 0 | 0 |

FIG. 8

| INTERNAL DATA | | TEST MODE | EXTERNAL DATA | FLAG |
|---|---|---|---|---|
| LEVEL | MSB/LSB | | | |
| VL14 | 11 | OTF | 1 | 0 |
| VL13 | 10 | OTF | 1 | 1 |
| VL12 | 01 | OTF | 0 | 1 |
| VL11 | 00 | OTF | 0 | 0 |

MULTI-LEVEL SIGNAL GENERATOR AND MEMORY DEVICE INCLUDING THE SAME

CROSS-REFERENCE TO RELATED APPLICATION

This application claims priority under 35 USC § 119 to Korean Patent Application No. 10-2020-0133850 filed on Oct. 16, 2020 in the Korean Intellectual Property Office (KIPO), the contents of which are herein incorporated by reference in their entirety.

BACKGROUND

1. Technical Field

Example embodiments relate generally to semiconductor integrated circuits, and more particularly to multi-level signal generators used to test memory devices, and memory devices including the multi-level signal generators.

2. Description of the Related Art

Semiconductor memory devices can generally be divided into two categories depending upon whether or not they retain stored data when disconnected from a power supply. These categories include volatile memory devices, which lose stored data when disconnected from power, and non-volatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered.

Recently, as the performance of the semiconductor memory device is improved, a high communication speed (or interface speed) is required between a memory controller and the semiconductor memory device. Thus, a multi-level signaling in which a plurality of bits are transmitted during one unit interval (UI) has been researched.

SUMMARY

At least one example embodiment of the present disclosure provides a multi-level signal generator capable of efficiently generating a multi-level signal that is used to test a memory device.

At least one example embodiment of the present disclosure provides a memory device that includes the multi-level signal generator.

According to example embodiments, a multi-level signal generator includes a receiving circuit, a setting circuit, a data bit generating circuit and a digital-to-analog converter. The receiving circuit receives an input data signal from an external device and generates a first data bit based on the input data signal having two voltage levels that are different from each other. The setting circuit receives a command signal from the external device and generates a flag signal based on the command signal. The flag signal is changed depending on an operation mode. The data bit generating circuit generates a plurality of internal bits based on the first data bit, selects at least one of the plurality of internal bits based on the flag signal, and outputs the selected internal bit as at least one additional data bit. The digital-to-analog converter generates an output data signal based on the first data bit and the at least one additional data bit. The output data signal is a multi-level signal having three or more voltage levels that are different from each other.

According to example embodiments, a memory device includes a first data input/output (I/O) pin, a first multi-level signal generator and a first multi-level signal receiver. The first data I/O pin receives a first input data signal or a second input data signal depending on an operation mode of the memory device. The first input data signal has two voltage levels that are different from each other. The second input data signal is a multi-level signal having three or more voltage levels that are different from each other. The first multi-level signal generator generates a first output data signal that is the multi-level signal based on the first input data signal. The first multi-level signal receiver receives the first output data signal or the second input data signal depending on the operation mode, and generates first reception data including two or more data bits. The first multi-level signal generator includes a receiving circuit, a setting circuit, a data bit generating circuit and a digital-to-analog converter. The receiving circuit generates a first data bit based on the first input data signal. The setting circuit generates a flag signal based on a command signal. The flag signal is changed depending on the operation mode. The data bit generating circuit generates a plurality of internal bits based on the first data bit, selects at least one of the plurality of internal bits based on the flag signal, and outputs the selected internal bit as at least one additional data bit. The digital-to-analog converter generates the first output data signal based on the first data bit and the at least one additional data bit.

According to example embodiments, a multi-level signal generator includes a receiving circuit, a setting circuit, a data bit generating circuit and a digital-to-analog converter. The receiving circuit receives an input data signal and generates a most significant bit (MSB) based on the input data signal. The input data signal has two voltage levels that are different from each other. The setting circuit receives a command signal and generates a flag signal based on the command signal. The flag signal has a fixed level or a variable level depending on an operation mode. The data bit generating circuit generates a first internal bit and a second internal bit that are different from each other based on the MSB, selects one of the first and second internal bits based on the flag signal, and outputs the selected internal bit as a least significant bit (LSB). The digital-to-analog converter generates an output data signal based on the MSB and the LSB. The output data signal is a four-level pulse amplitude modulation (PAM4) signal having four voltage levels that are different from each other. The data bit generating circuit includes an internal bit generator and a selector. The internal bit generator outputs the MSB as the first internal bit, and includes an inverter configured to generate the second internal bit having an inverted bit of the MSB. The selector outputs one of the first and second internal bits as the LSB based on the flag signal. The setting circuit includes a memory register sets and a flag generator. The memory register sets generates a first mode control signal for setting the operation mode to a test mode and a second mode control signal for generating the flag signal in the test mode based on the command signal. The flag generator generates the flag signal based on the second mode control signal.

The multi-level signal generator according to example embodiments may be included in the memory device operating based on the multi-level signaling scheme, and may be used to test the memory device. The multi-level signal generator may generate the output data signal that is the multi-level signal based on the input data signal that is the two-level signal. The memory device including the multi-level signal generator may be tested using an existing test equipment that generates the two-level signal, and thus a test operation may be performed with a relatively low cost. In addition, the test operation may be performed based on the two-level signal having a higher signal-to-noise ratio (SNR) than that of the multi-level signal, and thus the relatively large number of memory devices may be simultaneously tested.

Further, the multi-level signal generator according to example embodiments may generate the output data signal based on one input data signal including information associated with only one of two or more bits for generating the output data signal. Accordingly, the output data signal may be efficiently generated.

BRIEF DESCRIPTION OF THE DRAWINGS

Illustrative, non-limiting example embodiments will be more clearly understood from the following detailed description taken in conjunction with the accompanying drawings.

FIGS. 4, 5, 6, 7 and 8 are diagrams for describing an operation of a multi-level signal generator of FIG. 3 according to example embodiments.

DETAILED DESCRIPTION OF THE EMBODIMENTS

Figure 1:
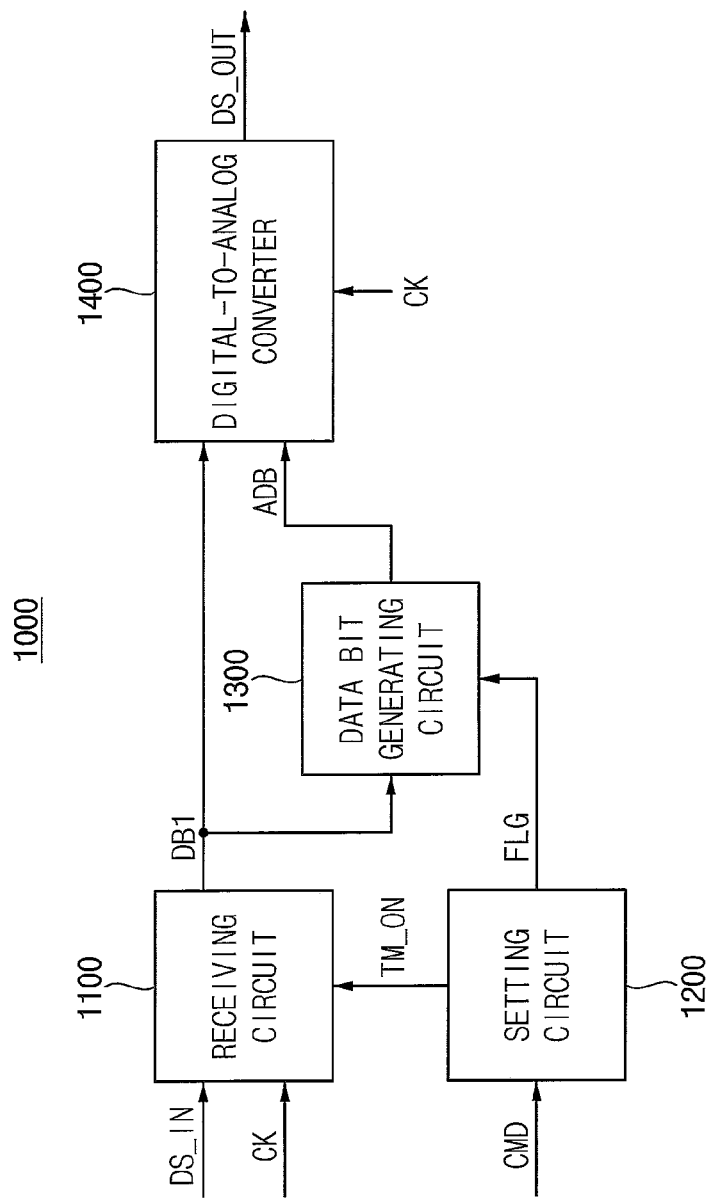
FIG. 1 is a block diagram illustrating a multi-level signal generator according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a multi-level signal generator according to example embodiments.

Referring to FIG. 1, a multi-level signal generator 1000 includes a receiving circuit 1100, a setting circuit 1200, a data bit generating circuit 1300 and a digital-to-analog converter 1400.

As will be described with reference to FIG. 9, the multi-level signal generator 1000 according to example embodiments may be included in a memory device. Thus, the multi-level signal generator 1000 may be referred to as an in-memory multi-level signal generator. For example, when the memory device is a dynamic random access memory (DRAM) as will be described with reference to FIG. 12, the multi-level signal generator 1000 may be referred to as an in-DRAM multi-level signal generator.

In addition, as will be described with reference to FIG. 13, the multi-level signal generator 1000 according to example embodiments may be used to test the memory device, and may operate in a test mode in which the memory device is tested. Thus, the multi-level signal generator 1000 may be referred to as a design for test (DFT) device (or circuit).

The receiving circuit 1100 generates a first data bit DB1 based on an input data signal DS_IN and a clock signal CK. The input data signal DS_IN has two voltage levels that are different from each other. For example, the input data signal DS_IN may be a two-level signal. For example, the input data signal DS_IN may have one of the two voltage levels during one unit interval (UI). For example, the input data signal DS_IN may be generated based on a non-return-to-zero (NRZ) scheme. For example, as will be described with reference to FIG. 13, the input data signal DS_IN may correspond to test data provided from an external test equipment (e.g., automated test equipment (ATE)).

The setting circuit 1200 generates a flag signal FLG based on a command signal CMD. The flag signal FLG is changed depending on an operation mode. The setting circuit 1200 may further generate a first mode control signal TM_ON for setting and/or enabling the test mode based on the command signal CMD. In some example embodiments, as will be described with reference to FIGS. 3 and 9, the setting circuit 1200 may not directly receive the command signal CMD, may receive a mode setting signal MS generated by a command decoder included in the memory device based on the command signal CMD, and may operate based on the mode setting signal MS.

The data bit generating circuit 1300 generates a plurality of internal bits based on the first data bit DB1, selects at least one of the plurality of internal bits based on the flag signal FLG, and outputs the selected internal bit as at least one additional data bit ADB.

In some example embodiments, the input data signal DS_IN may include only information associated with the first data bit DB1 and may not include information associated with the at least one additional data bit ADB. For example, the input data signal DS_IN may include only the information associated with the first data bit DB1 other than the information associated with the at least one additional data bit ADB. The data bit generating circuit 1300 may generate the plurality of internal bits and the at least one additional data bit ADB based on only the first data bit DB1 without the information associated with the at least one additional data bit ADB.

The digital-to-analog converter 1400 generates an output data signal DS_OUT based on the first data bit DB1, the at least one additional data bit ADB and the clock signal CK. Unlike the input data signal DS_IN, the output data signal DS_OUT has three or more voltage levels that are different from each other. For example, the output data signal DS_OUT may be a multi-level signal. For example, the output data signal DS_OUT may have one of the three or more voltage levels during one UI.

In the multi-level signal generator 1000 according to example embodiments, the output data signal DS_OUT is generated based on a multi-level signaling scheme. The multi-level signaling scheme may be used as a means of compressing the bandwidth required to transmit data at a given bit rate. In a simple binary scheme, two single symbols, usually two voltage levels, may be used to represent '1' and '0,' and thus the symbol rate may be equal to the bit rate. In contrast, the principle of the multi-level signaling scheme may be to use m symbols to represent data, so that each symbol may represent more than one bit of data. As a result, the number of symbols that needs to be transmitted may be less than the number of bits (e.g., the symbol rate may be less than the bit rate), and thus the bandwidth may be compressed. The symbols may be constructed from a number of different voltage levels. For example, in a four-level scheme, groups of two data bits may be mapped to one of four symbols. Only one symbol need be transmitted for each pair of data bits, so the symbol rate may be a half of the bit rate.

For example, the multi-level signaling scheme may be used to increase a data transmission (or transfer) rate without increasing the frequency of data transmission and/or a transmission power of the communicated data. An example of one type of the multi-level signaling scheme may be a pulse amplitude modulation (PAM) scheme, where a unique symbol of a multi-level signal may represent a plurality of bits of data. The number of possible pulse amplitudes in a digital PAM scheme may be some power of two. For example, there may be $2^2$ possible discrete pulse amplitudes in a 4-level PAM (e.g., in PAM4), there may be $2^3$ possible discrete pulse amplitudes in an 8-level PAM (e.g., in PAM8), and there may be $2^4$ possible discrete pulse amplitudes in a 16-level PAM (e.g., in PAM16). However, example embodiments are not limited thereto, and example embodiments may be applied or employed to an X-level PAM (e.g., PAM(X)) having X possible pulse amplitudes, where X is a natural number greater than or equal to three.

In some example embodiments, configurations of the digital-to-analog converter 1400 and the output data signal DS_OUT may be changed based on the number of the at least one additional data bit ADB.

The multi-level signal generator 1000 according to example embodiments may be included in the memory device operating based on the multi-level signaling scheme, and may be used to test the memory device. The multi-level signal generator 1000 may generate the output data signal DS_OUT that is the multi-level signal based on the input data signal DS_IN that is the two-level signal. The memory device including the multi-level signal generator 1000 may be to be tested using an existing test equipment that generates the two-level signal, and thus a test operation may be performed with a relatively low cost. In addition, the test operation may be performed based on the two-level signal with a higher signal-to-noise ratio (SNR) than the multi-level signal, and thus the relatively large number of memory devices may be simultaneously tested.

Further, the multi-level signal generator 1000 according to example embodiments may generate the output data signal DS_OUT based on one input data signal DS_IN including the information associated with only one of two or more bits for generating the output data signal DS_OUT. Accordingly, as compared to a case of generating an output data signal based on two or more input data signals including information associated with two or more bits, the output data signal DS_OUT may be efficiently generated.

Figure 2A:
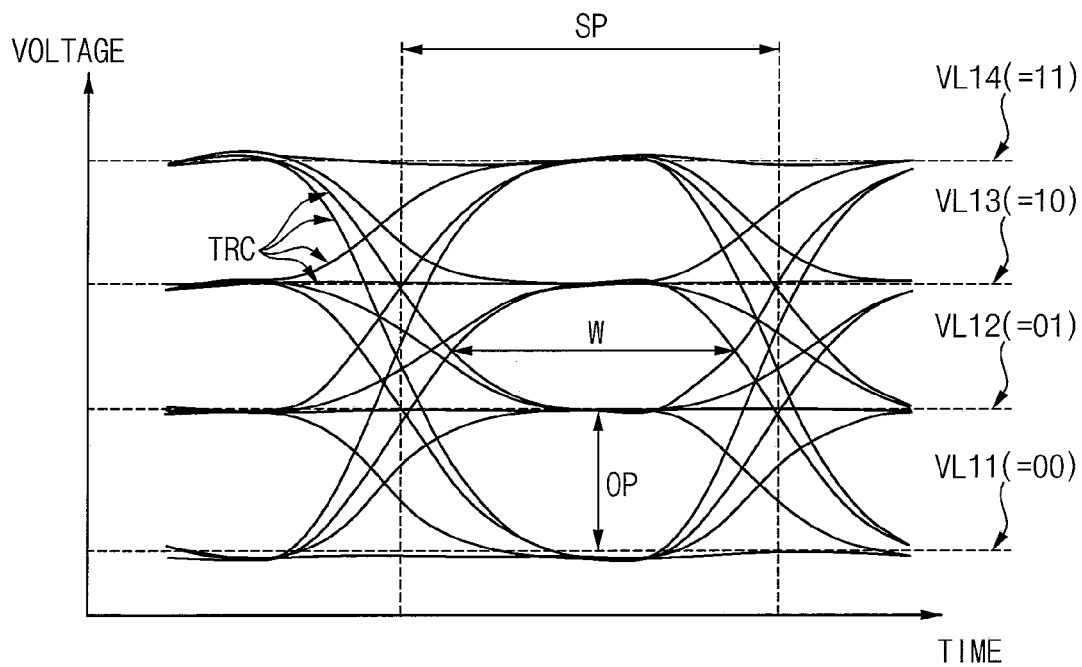
FIGS. 2A and 2B are diagrams for describing a multi-level signal and a two-level signal used in a multi-level signal generator according to example embodiments.
Figure 2B:
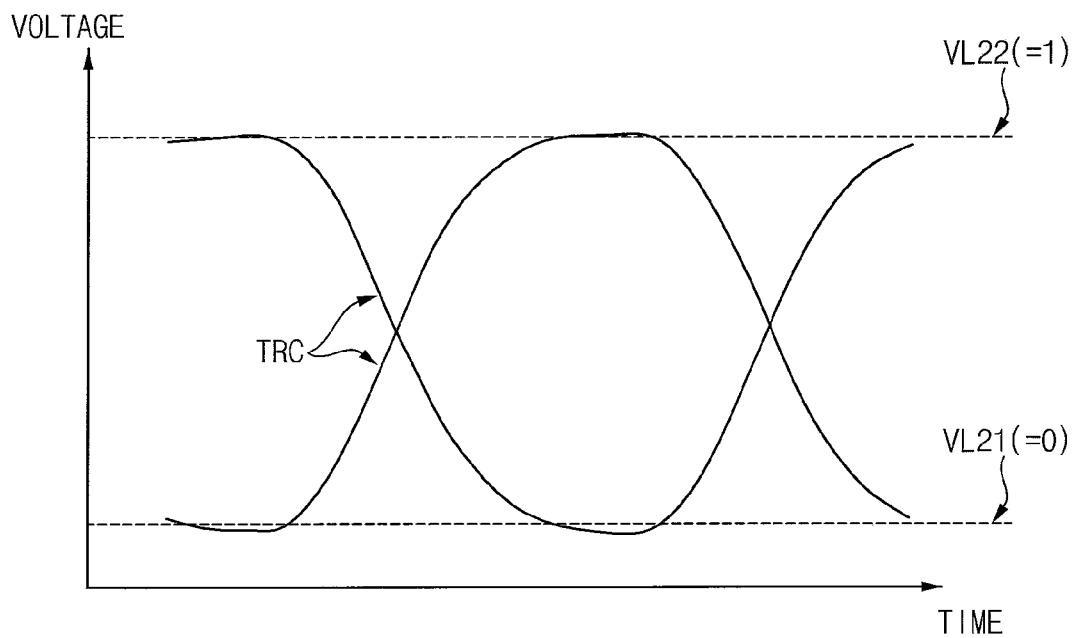

FIGS. 2A and 2B are diagrams for describing a multi-level signal and a two-level signal used in a multi-level signal generator according to example embodiments.

Referring to FIG. 2A, an ideal eye diagram of a data signal (e.g., a PAM4 signal) generated based on the 4-level scheme (e.g., the PAM4 scheme) that is an example of the multi-level signaling scheme (e.g., the PAM scheme) is illustrated. The PAM4 signal in FIG. 2A may be an example of the output data signal DS_OUT in FIG. 1.

An eye diagram may be used to indicate the quality of signals in high-speed transmissions. For example, the eye diagram in FIG. 2A may represent four symbols of a signal (e.g., '00', '01', '10' and '11'), and each of the four symbols may be represented by a respective one of different voltage levels (e.g., voltage amplitudes) VL11, VL12, VL13 and VL14. The eye diagram may be used to provide a visual indication of the health of the signal integrity, and may indicate noise margins of the data signal.

To generate the eye diagram, an oscilloscope or other computing device may sample a digital signal according to a sample period SP (e.g., a unit interval or a bit period). The sample period SP may be defined by a clock associated with the transmission of the measured signal. The oscilloscope or other computing device may measure the voltage level of the signal during the sample period SP to form the plurality of traces TRC. Various characteristics associated with the measured signal may be determined by overlaying the plurality of traces TRC.

The eye diagram may be used to identify a number of characteristics of a communication signal such as jitter, cross talk, electromagnetic interference (EMI), signal loss, signal-to-noise ratio (SNR), other characteristics, or combinations thereof. For example, a width W of an eye in the eye diagram may be used to indicate a timing synchronization of the measured signal or jitter effects of the measured signal. For example, the eye diagram may indicate an eye opening OP, which represents a peak-to-peak voltage difference between the various voltage levels VL11, VL12, VL13 and VL14. The eye opening OP may be related to a voltage margin for discriminating between different voltage levels VL11, VL12, VL13 and VL14 of the measured signal.

Referring to FIG. 2B, an ideal eye diagram of a data signal (e.g., an NRZ signal) generated based on the NRZ scheme that is an example of the two-level signaling scheme is illustrated. The NRZ signal in FIG. 2B may be an example of the input data signal DS_IN in FIG. 1. The descriptions repeated with FIG. 2A will be omitted.

An eye diagram may be used to indicate the quality of signals in high-speed transmissions. For example, the eye diagram in FIG. 2B may represent two symbols of a signal (e.g., '0' and '1'), and each of the two symbols may be represented by a respective one of different voltage levels (e.g., voltage amplitudes) VL21 and VL22.

In some example embodiments, the voltage level VL21, which is a low voltage level among the voltage levels VL21 and VL22 in FIG. 2B, may be equal to the voltage level VL11, which is the lowest voltage level among the voltage levels VL11, VL12, VL13 and VL14 in FIG. 2A. The voltage level VL22, which is a high voltage level among the voltage levels VL21 and VL22 in FIG. 2B, may be equal to the voltage level VL14, which is the highest voltage level among the voltage levels VL11, VL12, VL13 and VL14 in FIG. 2A. However, example embodiments are not limited thereto, and the voltage levels VL11, VL12, VL13, VL14, VL21 and VL22 may be changed according to example embodiments.

Hereinafter, example embodiments will be described in detail based on the NRZ scheme and the PAM4 scheme, e.g., based on an example where the input data signal DS_IN and the output data signal DS_OUT in FIG. 1 are the NRZ signal and the PAM4 signal, respectively. However, example embodiments are not limited thereto, and example embodiments may be applied or employed to the PAM(X) scheme having X possible pulse amplitudes.

Figure 3:
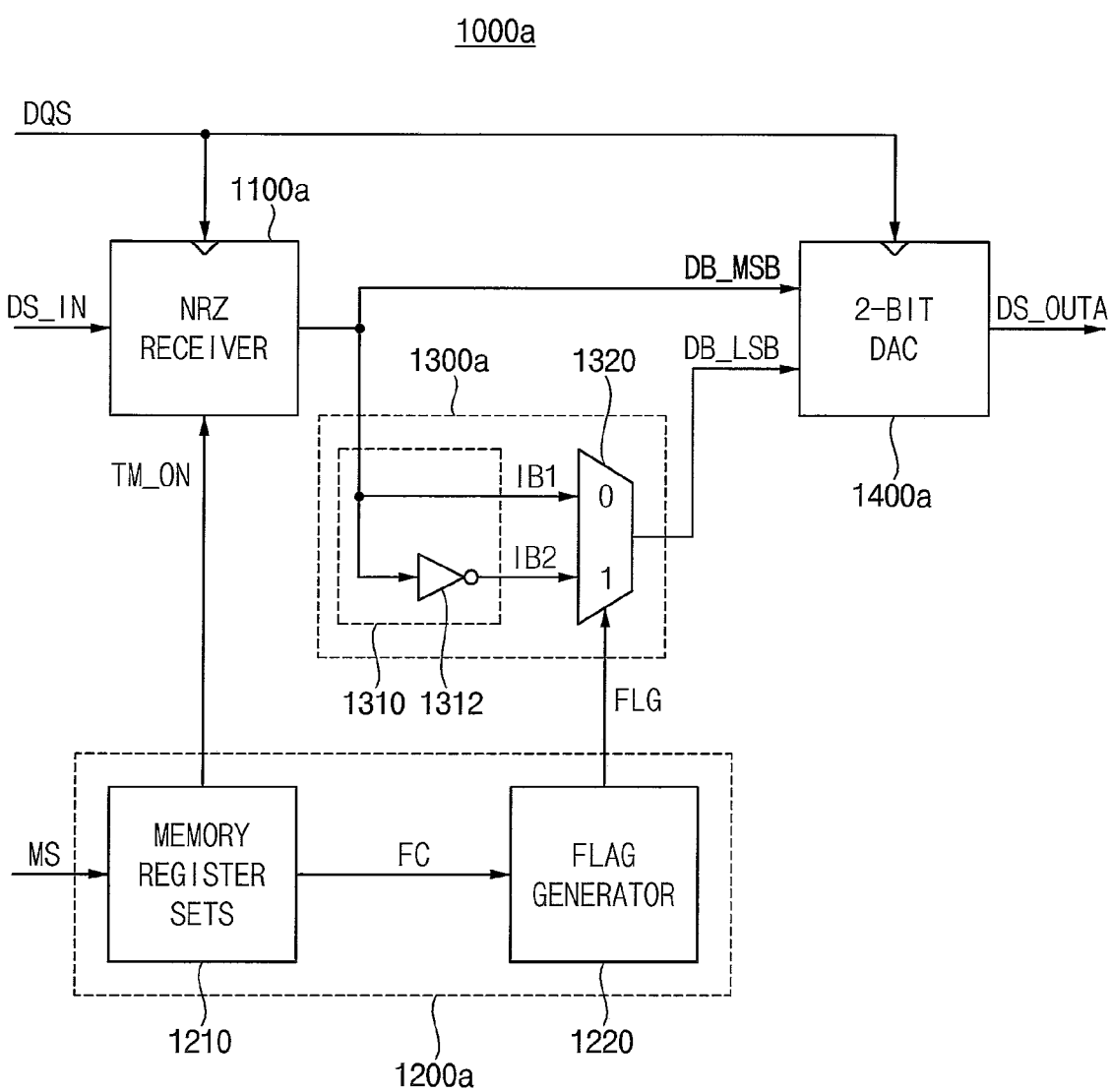
FIG. 3 is a block diagram illustrating an example of a multi-level signal generator of FIG. 1 according to example embodiments.

FIG. 3 is a block diagram illustrating an example of a multi-level signal generator of FIG. 1 according to a certain embodiment. The descriptions repeated with FIG. 1 will be omitted.

Referring to FIG. 3, a multi-level signal generator 1000a includes a receiving circuit 1100a, a setting circuit 1200a, a data bit generating circuit 1300a and a digital-to-analog converter 1400a.

The receiving circuit 1100a generates a first data bit DB_MSB based on the input data signal DS_IN and a data strobe signal DQS. The input data signal DS_IN may be the NRZ signal, and the data strobe signal DQS may be provided as the clock signal CK. For example, the receiving circuit 1100a may be an NRZ receiver that receives the input data signal DS_IN that is the NRZ signal. For example, the first data bit DB_MSB may be a most significant bit (MSB) for generating an output data signal DS_OUTA that is the PAM4 signal. The input data signal DS_IN may include only information associated with the MSB.

The setting circuit 1200a generates the first mode control signal TM_ON and the flag signal FLG based on the command signal CMD. The setting circuit 1200a may include a memory register sets 1210 and a flag generator 1220.

The memory register sets 1210 may generate the first mode control signal TM_ON for setting the operation mode to the test mode and a second mode control signal FC for generating the flag signal FLG in the test mode based on the command signal CMD, e.g., based on the mode setting signal MS that is generated based on the command signal CMD.

The flag generator 1220 may generate the flag signal FLG based on the second mode control signal FC. As will be described with reference to FIGS. 4, 5 and 7, the flag signal FLG may have a fixed level or a variable level depending on the operation mode, e.g., depending on the type of test mode.

In some example embodiments, the test mode may include a first operation mode, a second operation mode and a third operation mode that are different from each other. An operation of the multi-level signal generator 1000a in the first, second and third operation modes will be described with reference to FIGS. 4 through 8.

The data bit generating circuit 1300a generates a plurality of internal bits IB1 and IB2 based on the first data bit DB_MSB, selects one of the plurality of internal bits IB1 and IB2 based on the flag signal FLG, and outputs the selected one of the plurality of internal bits D31 and IB2 as a second data bit DB_LSB that is the at least one additional data bit ADB. For example, the at least one additional data bit ADB may include the second data bit DB_LSB. For example, the second data bit DB_LSB may be a least significant bit (LSB) for generating the output data signal DS_OUTA that is the PAM4 signal.

The data bit generating circuit 1300a may include an internal bit generator 1310 and a selector 1320.

The internal bit generator 1310 may generate the first internal bit D31 and the second internal bit IB2 that are different from each other based on the first data bit DB_MSB. For example, the first internal bit IB1 may be the first data bit DB_MSB, and the internal bit generator 1310 may provide the first data bit DB_MSB as the first internal bit IB1. For example, the second internal bit IB2 may be an inverted bit of the first data bit DB_MSB, and the internal bit generator 1310 may include an inverter 1312 that provides the second internal bit IB2 by inverting the first data bit DB_MSB.

The selector 1320 may output one of the first and second internal bits IB1 and IB2 as the second data bit DB_LSB based on the flag signal FLG. For example, the selector 1320 may be a multiplexer. For example, when the flag signal FLG has a first logic level (e.g., '0'), the selector 1320 may output the first internal bit D31 as the second data bit DB_LSB. When the flag signal FLG has a second logic level (e.g., '1'), the selector 1320 may output the second internal bit IB2 as the second data bit DB_LSB.

The digital-to-analog converter 1400a generates the output data signal DS_OUTA that is the PAM4 signal based on the first and second data bits DB_MSB and DB_LSB. For example, the digital-to-analog converter 1400a may be a 2-bit digital-to-analog converter that generates the output data signal DS_OUTA having four voltage levels (e.g., the voltage levels VL11, VL12, VL13 and VL14 in FIG. 2A) based on two data bits DB_MSB and DB_LSB.

FIGS. 4, 5, 6, 7 and 8 are diagrams for describing an operation of a multi-level signal generator of FIG. 3 according to a certain embodiment.

Figure 4:
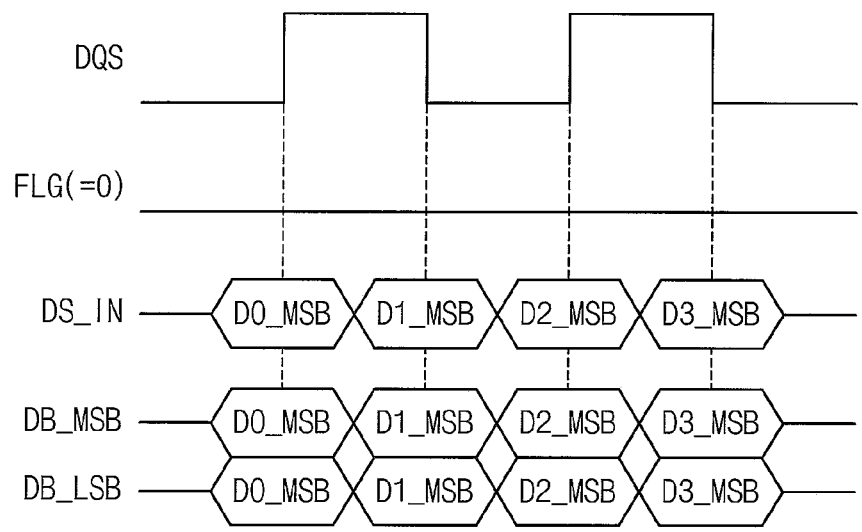

Referring to FIG. 4, an operation of the multi-level signal generator 1000a in the first operation mode is illustrated. The first operation mode may be referred to as a first test mode or a non-inversion mode.

The operation mode may be set to the first operation mode based on the command signal CMD, test data to be stored in the memory device in the first operation mode may be provided as write data. For example, the command signal CMD may include a first command for setting the operation mode and a second command (e.g., a write command) for writing the test data.

The input data signal DS_IN may include a plurality of data bits D0_MSB, D1_MSB, D2_MSB and D3_MSB that correspond to MSBs of the test data. The plurality of data bits D0_MSB, D1_MSB, D2_MSB and D3_MSB included in the input data signal DS_IN may be provided corresponding to rising and falling edges of the data strobe signal DQS. For example, the input data signal DS_IN may be provided based on a double data rate (DDR) scheme.

The plurality of data bits D0_MSB, D1_MSB, D2_MSB and D3_MSB may be sequentially provided as the first data bit DB_MSB by the receiving circuit 1100a.

The flag signal FLG may have a fixed level in the first operation mode. For example, the flag signal FLG may always have the first logic level (e.g., '0') in the first operation mode. The selector 1320 may always output the first internal bit D31 as the second data bit DB_LSB based on the flag signal FLG in the first operation mode. As described above, the first internal bit IB1 may be equal to the first data bit DB_MSB, and thus the selector 1320 may always output the second data bit DB_LSB equal to the first data bit DB_MSB. For example, the plurality of data bits D0_MSB, D1_MSB, D2_MSB and D3_MSB may be sequentially provided as the second data bit DB_LSB by the data bit generating circuit 1300a.

In the first operation mode, the digital-to-analog converter 1400*a* may receive the first and second data bits DB_MSB and DB_LSB that are the same data bits (e.g., the bit D0_MSB). Thus, the digital-to-analog converter 1400*a* may generate the output data signal DS_OUTA that has a voltage level (e.g., the voltage level VL11 in FIG. 2A) corresponding to '00' and a voltage level (e.g., the voltage level VL14 in FIG. 2A) corresponding to '11'.

Figure 5:
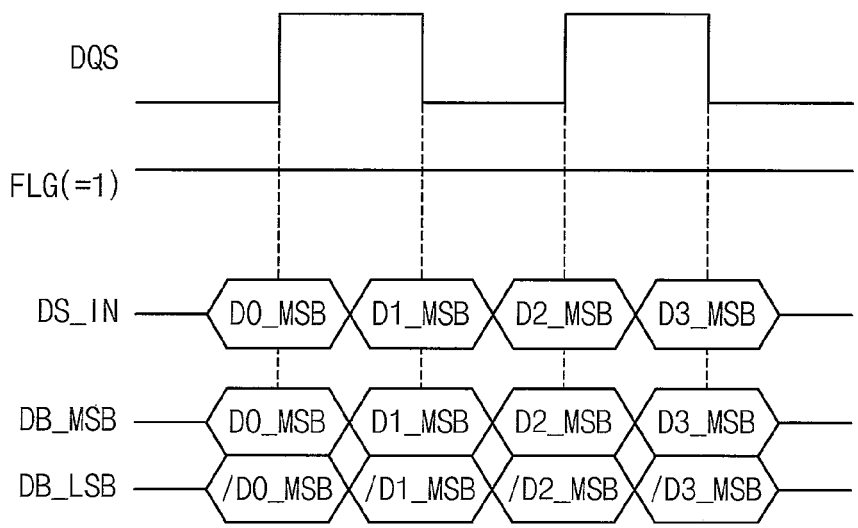

Referring to FIG. 5, an operation of the multi-level signal generator 1000*a* in the second operation mode is illustrated. The second operation mode may be referred to as a second test mode or an inversion mode. The descriptions repeated with FIG. 4 will be omitted.

The flag signal FLG may have a fixed level in the second operation mode. For example, the flag signal FLG may always have the second logic level (e.g., '1') in the second operation mode. The selector 1320 may always output the second internal bit IB2 as the second data bit DB_LSB based on the flag signal FLG having the second logic level in the second operation mode. As described above, the second internal bit IB2 may be equal to the inverted bit of the first data bit DB_MSB, and thus the selector 1320 may always output the second data bit DB_LSB equal to the inverted bit of the first data bit DB_MSB. For example, inverted bits /D0_MSB, /D1_MSB, /D2_MSB and /D3_MSB of the plurality of data bits D0_MSB, D1_MSB, D2_MSB and D3_MSB may be sequentially provided as the second data bit DB_LSB by the data bit generating circuit 1300*a*.

In the second operation mode, the digital-to-analog converter 1400*a* may receive the first and second data bits DB_MSB and DB_LSB that are opposing data bits (e.g., the bits D0_MSB and /D0_MSB, D1_MSB and /D1_MSB, D2_MSB and /D2_MSB, and D3_MSB and /D3_MSB). Thus, the digital-to-analog converter 1400*a* may generate the output data signal DS_OUTA that has a voltage level (e.g., the voltage level VL12 in FIG. 2A) corresponding to '01' and a voltage level (e.g., the voltage level VL13 in FIG. 2A) corresponding to '10'.

Figures 6, 7:
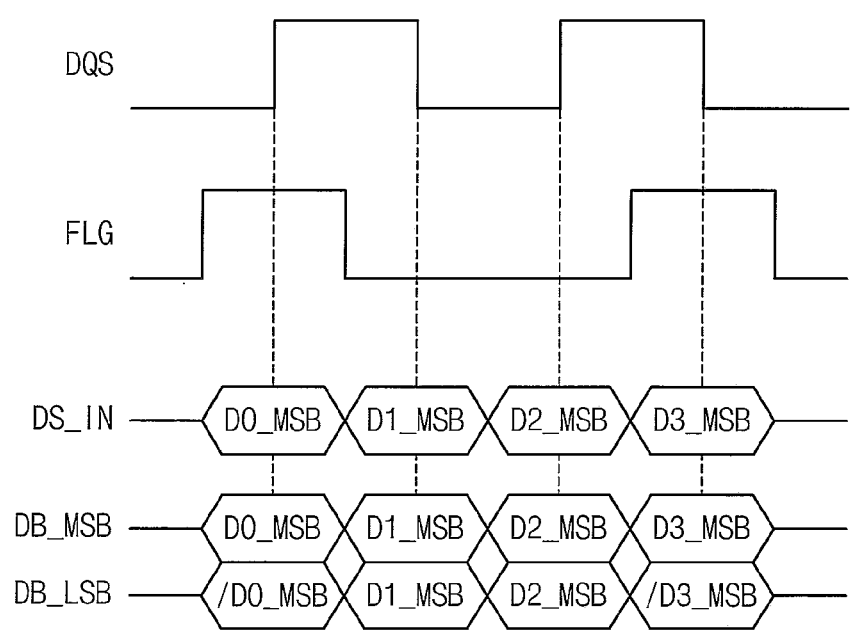

Referring to FIG. 6, all of four voltage levels (e.g., the voltage levels VL11, VL12, VL13 and VL14 in FIG. 2A) included in the output data signal DS_OUTA may be generated by combining the first operation mode and the second operation mode.

For example, the flag signal FLG may always have a value of '0' in the first operation mode (e.g., a non-inversion mode NON_INV). When an external data (e.g., the input data signal DS_IN) has a value of '0', both the first and second data bits DB_MSB and DB_LSB may have a value of '0', and the output data signal DS_OUTA may have the voltage level VL11 (e.g., '00'). When the external data has a value of '1', both the first and second data bits DB_MSB and DB_LSB may have a value of '1', and the output data signal DS_OUTA may have the voltage level VL14 (e.g., '11').

Similarly, the flag signal FLG may always have a value of '1' in the second operation mode (e.g., an inversion mode INV). When the external data has a value of '0', the first and second data bits DB_MSB and DB_LSB may have values of '0' and '1', respectively, and the output data signal DS_OUTA may have the voltage level VL12 (e.g., '01'). When the external data has a value of '1', the first and second data bits DB_MSB and DB_LSB may have values of '1' and '0', respectively, and the output data signal DS_OUTA may have the voltage level VL13 (e.g., '10').

Referring to FIG. 7, an operation of the multi-level signal generator 1000*a* in the third operation mode is illustrated. The third operation mode may be referred to as a third test mode or an on the fly mode. The descriptions repeated with FIGS. 4 and 5 will be omitted.

The flag signal FLG may toggle between the first logic level (e.g., '0') and the second logic level (e.g., '1') in the third operation mode. The selector 1320 may output one of the first and second internal bits D31 and IB2 as the second data bit DB_LSB based on the flag signal FLG in the third operation mode. For example, when the data bits D0_MSB and D3_MSB are provided, the flag signal FLG may have the second logic level, and thus the inverted bits /D0_MSB and /D3_MSB of the data bits D0_MSB and D3_MSB may be provided as the second data bit DB_LSB. When the data bits D1_MSB and D2_MSB are provided, the flag signal FLG may have the first logic level, and thus the data bits D1_MSB and D2_MSB may be provided as the second data bit DB_LSB.

In the third operation mode, the digital-to-analog converter 1400*a* may generate the output data signal DS_OUTA that has voltage levels (e.g., the voltage levels VL11, VL12, VL13 and VL14 in FIG. 2A) corresponding to '00', '01', '10', and '11' depending on the logic level of the flag signal FLG.

In some example embodiments, values of the flag signal FLG may have a predetermined pattern depending on values of the test data. For example, the predetermined pattern of the flag signal FLG may be stored in the flag generator 1220 in advance or in the memory device including the multi-level signal generator 1000*a* in advance.

Referring to FIG. 8, all of four voltage levels (e.g., the voltage levels VL11, VL12, VL13 and VL14 in FIG. 2A) included in the output data signal DS_OUTA may be generated by only the third operation mode (e.g., an on the fly mode OTF). Thus, all voltage levels of the PAM4 signal may be generated without changing the operating mode. The descriptions repeated with FIG. 6 will be omitted.

The multi-level signal generator 1000*a* according to example embodiments may efficiently generate the output data signal DS_OUTA that is the PAM4 signal based on the input data signal DS_IN that is the two-level signal including only the MSB of the test data.

Figure 9:
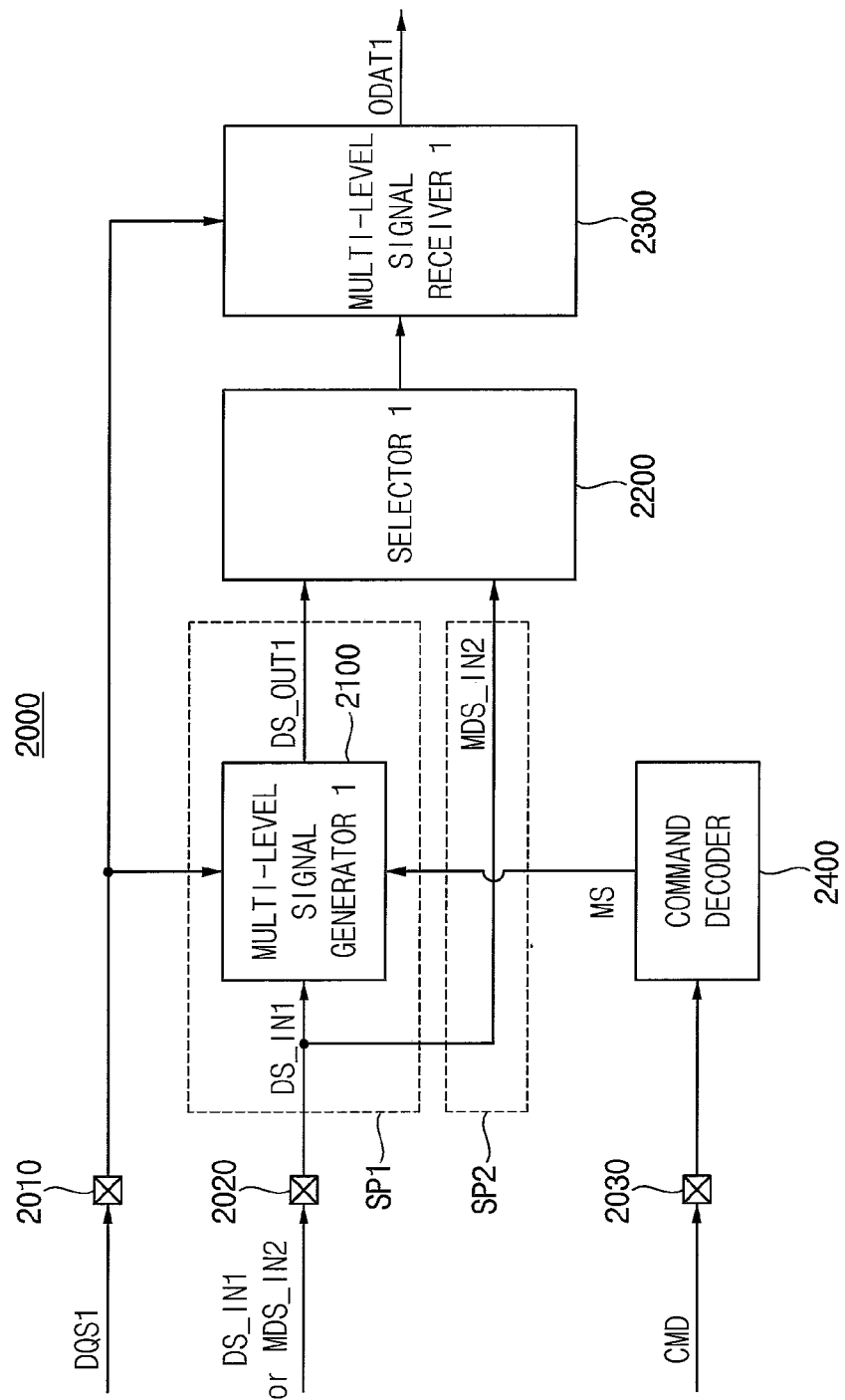
FIG. 9 is a block diagram illustrating a memory device according to example embodiments.

FIG. 9 is a block diagram illustrating a memory device according to example embodiments. The descriptions repeated with FIGS. 1 and 3 will be omitted.

Referring to FIG. 9, a memory device 2000 includes a first data input/output (I/O) pin 2020, a first multi-level signal generator 2100 and a first multi-level signal receiver 2300. The memory device 2000 may further include a first data strobe pin 2010, a command pin 2030, a first signal path SP1, a second signal path SP2, a first selector 2200 and a command decoder 2400.

In some example embodiments, the memory device 2000 may operate based on a multi-level signaling scheme, and may be a DRAM. A detailed configuration of the memory device 2000 will be described with reference to FIG. 12.

The first data strobe pin 2010 may receive a first data strobe signal DQS1. The first data strobe signal DQS1 may be a signal corresponding to the clock signal CK in FIG. 1 or the data strobe signal DQS in FIG. 3.

The first data I/O pin 2020 receives a first input data signal DS_IN1 or a second input data signal MDS_IN2 depending on an operation mode. The first input data signal DS_IN1 is a two-level signal having two voltage levels that are different from each other, and the second input data signal MDS_IN2 is a multi-level signal having three or more voltage levels that are different from each other.

In some example embodiments, the first input data signal DS_IN1 may correspond to test data, and may be received from an external test equipment (e.g., a test equipment 3100 in FIG. 13) in a test mode in which the memory device 2000 is tested. The second input data signal MDS_IN2 may correspond to normal data or write data (e.g., user data), and may be received from an external memory controller (e.g., a memory controller 20 in FIG. 16) in a normal mode in which the memory device 2000 normally operates.

The command pin 2030 may receive a command signal CMD. For example, the command signal CMD may include a command for setting the operation mode and a write command for writing data. For example, an unallocated pin and an undefined bit in a write command truth table may be used as the command pin 2030 and a test mode setting bit.

In some example embodiments, each of the first data strobe pin 2010, the first data I/O pin 2020 and the command pin 2030 may be a contact pin or a contact pad of the memory device, but example embodiments are not limited thereto.

The first multi-level signal generator 2100 generates a first output data signal DS_OUT1 based on the first data strobe signal DQS1, the first input data signal DS_IN1 and a mode setting signal MS corresponding to the command signal CMD. As with the second input data signal MDS_IN2, the first output data signal DS_OUT1 is a multi-level signal.

The first multi-level signal generator 2100 may be the multi-level signal generator according to example embodiments. For example, as illustrated in FIG. 1, the first multi-level signal generator 2100 includes a receiving circuit, a setting circuit, a data bit generating circuit and a digital-to-analog converter. The first multi-level signal generator 2100 may generate the first output data signal DS_OUT1 that is the multi-level signal based on the first input data signal DS_IN1 that is the two-level signal including only one bit information. The first output data signal DS_OUT1 may be used to generate multi-bit data including two or more bits.

The first signal path SP1 may be disposed between the first data I/O pin 2020 and the first multi-level signal receiver 2300 (e.g., between the first data I/O pin 2020 and the first selector 2200). The first signal path SP1 may include the first multi-level signal generator 2100, may receive the first input data signal DS_IN1, and may provide the first output data signal DS_OUT1.

The second signal path SP2 may be disposed between the first data I/O pin 2020 and the first multi-level signal receiver 2300 (e.g., between the first data I/O pin 2020 and the first selector 2200). The second signal path SP2 may provide the second input data signal MDS_IN2.

The first selector 2200 may select one of the first and second signal paths SP1 and SP2 depending on the operation mode. The first selector 2200 may output the data signal provided from the selected signal path.

In some example embodiments, the first signal path SP1 may be selected and enabled in the test mode in which the memory device 2000 is tested. The second signal path SP2 may be selected and enabled in the normal mode in which the memory device 2000 normally operates.

The first multi-level signal receiver 2300 receives the data signal output from the first selector 2200. For example, the first multi-level signal receiver 2300 receives the first output data signal DS_OUT1 or the second input data signal MDS_IN2 depending on the operation mode. The first multi-level signal receiver 2300 generates first reception data ODAT1 based on the received data signal. The first reception data ODAT1 is multi-bit data including two or more data bits.

The command decoder 2400 may generate the mode setting signal MS by decoding the command signal CMD.

The memory device 2000 according to example embodiments may operate based on the multi-level signaling scheme, and may include the first multi-level signal generator 2100. The first multi-level signal generator 2100 may generate the first output data signal DS_OUT1 that is the multi-level signal based on the first input data signal DS_IN1 that is used in the test mode and is the two-level signal. The memory device 2000 that operates based on the multi-level signaling scheme may be tested using an existing test equipment that generates the two-level signal, and thus the test operation may be performed with a relatively low cost.

Figure 10:
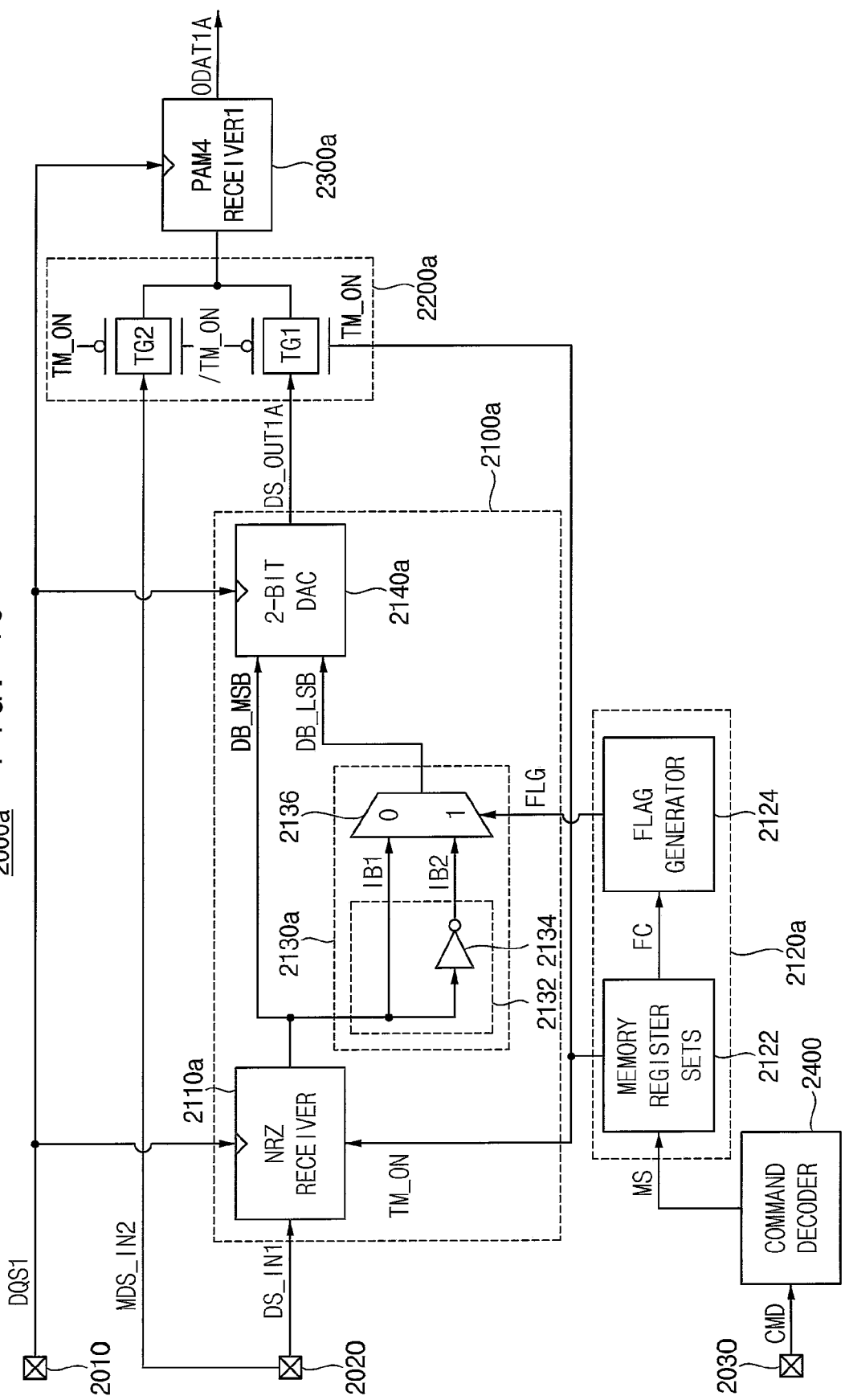
FIG. 10 is a block diagram illustrating an example of a memory device of FIG. 9 according to example embodiments.

FIG. 10 is a block diagram illustrating an example of a memory device of FIG. 9 according to a certain embodiment. The descriptions repeated with FIGS. 3 and 9 will be omitted.

Referring to FIG. 10, a memory device 2000*a* may include a first data strobe pin 2010, a first data I/O pin 2020, a command pin 2030, a first signal path, a second signal path, a first multi-level signal generator 2100*a*, a first selector 2200*a*, a first multi-level signal receiver 2300*a* and a command decoder 2400.

The first multi-level signal generator 2100*a* in FIG. 10 may be the same as the multi-level signal generator 1000*a* of FIG. 3, and may generate a first output data signal DS_OUT1A that is the PAM4 signal based on the first input data signal DS_IN1 that is the NRZ signal. For example, a receiving circuit 2110*a*, a setting circuit 2120*a*, a memory register sets 2122, a flag generator 2124, a data bit generating circuit 2130*a*, an internal bit generator 2132, an inverter 2134, a selector 2136 and a digital-to-analog converter 2140*a* included in the first multi-level signal generator 2100*a* in FIG. 10 may be the same as the receiving circuit 1100*a*, a setting circuit 1200*a*, a memory register sets 1210, a flag generator 1220, a data bit generating circuit 1300*a*, an internal bit generator 1310, an inverter 1312, a selector 1320 and a digital-to-analog converter 1400*a* in FIG. 3, respectively.

The first selector 2200*a* may output the first output data signal DS_OUT1A provided through the first signal path or the second input data signal MDS_IN2 provided through the second signal path based on the first mode control signal TM_ON and an inverted signal /TM_ON of the first mode control signal TM_ON. The first selector 2200*a* may include a first transmission gate TG1 connected to the first signal path and a second transmission gate TG2 connected to the second signal path.

The first multi-level signal receiver 2300*a* may generate first reception data ODAT1A based on an output of the first selector 2200*a* and the first data strobe signal DQS1. The first reception data ODAT1A may be two-bit data including two data bits that are different from each other. For example, the first multi-level signal receiver 2300*a* may be a PAM4 receiver that generates the first reception data ODAT1A that is the two-bit data based on the first output data signal DS_OUT1A or the second input data signal MDS_IN2 that is the PAM4 signal.

Figure 11:
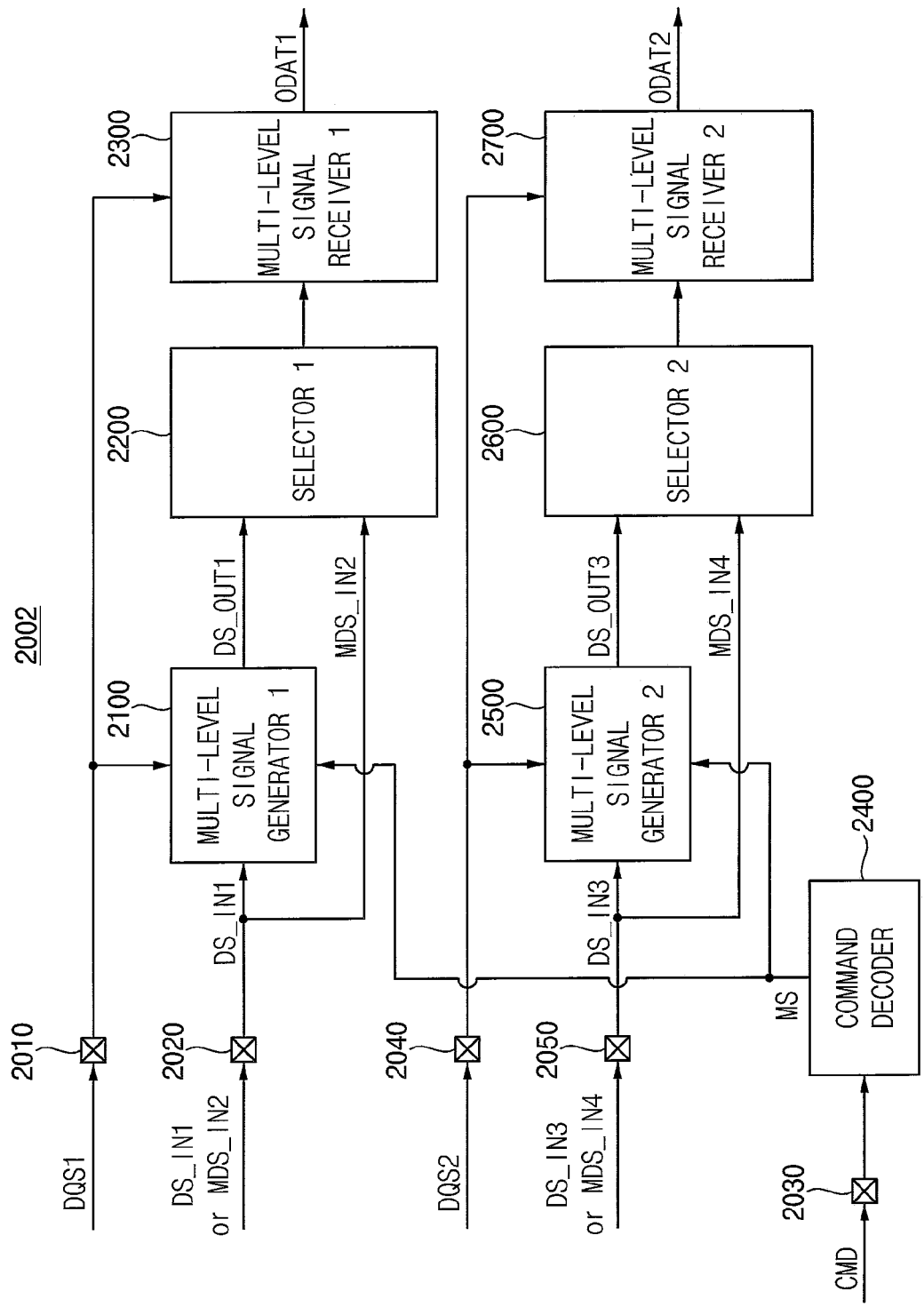
FIG. 11 is a block diagram illustrating a memory device according to example embodiments.

FIG. 11 is a block diagram illustrating a memory device according to example embodiments. The descriptions repeated with FIG. 9 will be omitted.

Referring to FIG. 11, a memory device 2002 includes a first data strobe pin 2010, a first data I/O pin 2020, at least one command pin 2030, a first multi-level signal generator 2100, a first selector 2200, a first multi-level signal receiver 2300 and a command decoder 2400. The memory device

2002 may further include a second data strobe pin 2040, a second data I/O pin 2050, a second multi-level signal generator 2500, a second selector 2600 and a second multi-level signal receiver 2700.

The memory device 2002 may be the same as the memory device 2000 of FIG. 9, except that the memory device 2002 further includes the second data strobe pin 2040, the second data I/O pin 2050, the second multi-level signal generator 2500, the second selector 2600 and the second multi-level signal receiver 2700.

The second data strobe pin 2040 may receive a second data strobe signal DQS2.

The second data I/O pin 2050 may receive a third input data signal DS_IN3 or a fourth input data signal MDS_IN4 depending on the operation mode. The third input data signal DS_IN3 may be a two-level signal having two voltage levels that are different from each other, and the fourth input data signal MDS_IN4 may be a multi-level signal having three or more voltage levels that are different from each other.

The second multi-level signal generator 2500 may generate a second output data signal DS_OUT3 based on the second data strobe signal DQS2, the third input data signal DS_IN3 and the mode setting signal MS. The second output data signal DS_OUT3 may be a multi-level signal.

Although not illustrated in FIG. 11, as with the first signal path SP1 in FIG. 9, a signal path that receives the third input data signal DS_IN3, provides the second output data signal DS_OUT3 and includes the second multi-level signal generator 2500 may form a third signal path. As with the second signal path SP2 in FIG. 9, a signal path that provides the fourth input data signal MDS_IN4 may form a fourth signal path.

The second selector 2600 may select one of the third and fourth signal paths depending on the operation mode, and may output the second output data signal DS_OUT3 or the fourth input data signal MDS_IN4.

The second multi-level signal receiver 2700 may receive the second output data signal DS_OUT3 or the fourth input data signal MDS_IN4 depending on the operation mode, and may generate second reception data ODAT2 based on the received data signal. The second reception data ODAT2 may be multi-bit data.

In some example embodiments, configurations of the second multi-level signal generator 2500, the second selector 2600 and the second multi-level signal receiver 2700 may be the same as those of the first multi-level signal generator 2100, the first selector 2200 and the first multi-level signal receiver 2300, respectively. Thus, the second data strobe signal DQS2, the third input data signal DS_IN3, the fourth input data signal MDS_IN4, the second output data signal DS_OUT3 and the second reception data ODAT2 may be similar to the first data strobe signal DQS1, the first input data signal DS_IN1, the second input data signal MDS_IN2, the first output data signal DS_OUT1 and the first reception data ODAT1, respectively.

In some example embodiments, one command signal CMD and one command pin 2030 may be shared by the first and second multi-level signal generators 2100 and 2500. Conventionally, when the signals are implemented based on the PAM4 scheme, four pins are required to receive two input data signals each of which includes two data bits. In contrast, when the memory device is implemented according to example embodiments and the signals are implemented based on the PAM4 scheme, three pins may be required to receive two input data signals each of which includes two data bits, each of two pins may receive a respective one bit of each input data signal, and the remaining one pin may receive the command signal CMD.

Although example embodiments are described based on an example where the memory device includes two multi-level signal generators and two multi-level signal receivers, example embodiments are not limited thereto. For example, the memory device may include N multi-level signal generators and N multi-level signal receivers, where N is a natural number greater than or equal to three, and only (N+1) pins may be required other than 2*N pins when the signals are implemented based on the PAM4 scheme.

Figure 12:
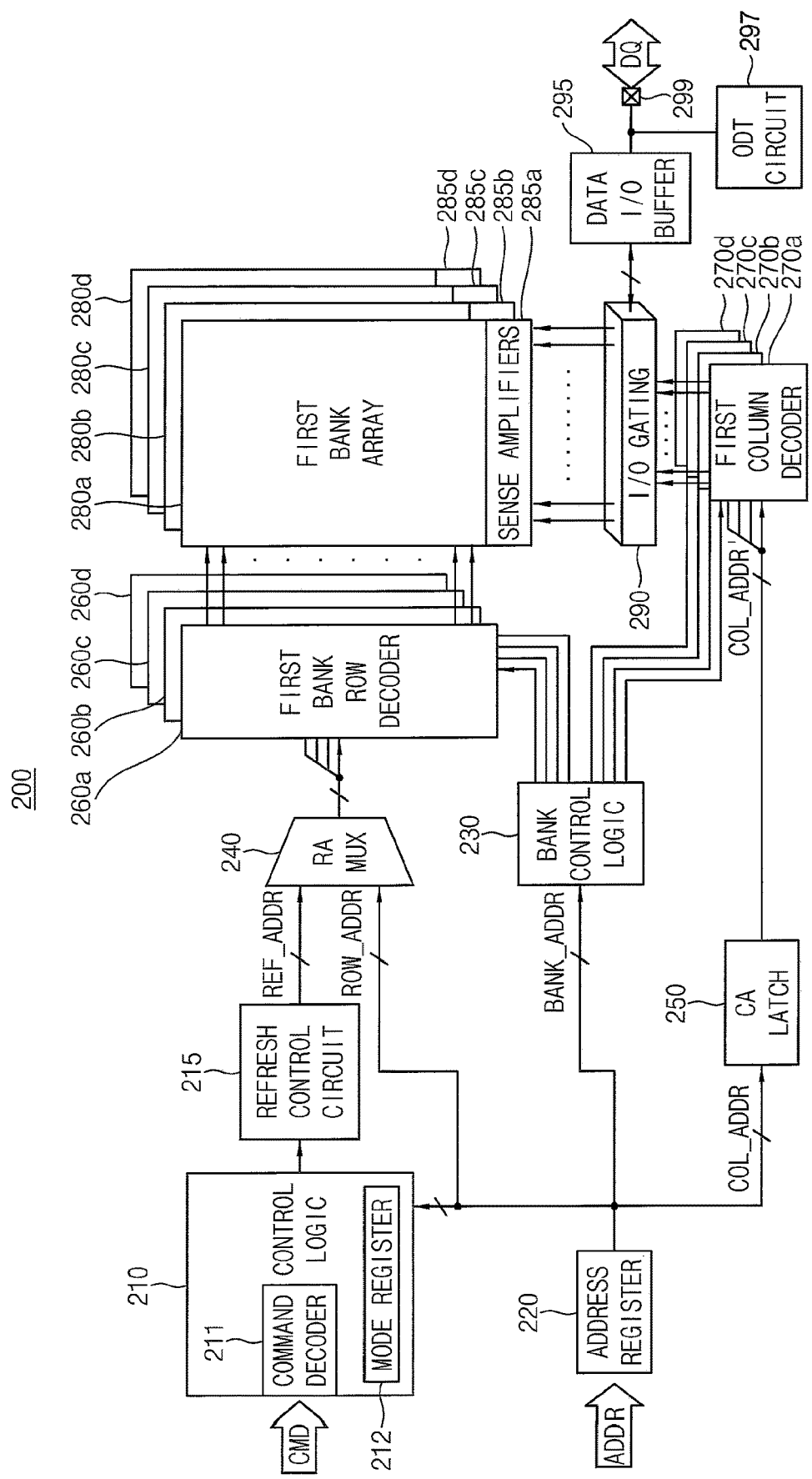
FIG. 12 is a block diagram illustrating an example of a memory device according to example embodiments.

FIG. 12 is a block diagram illustrating an example of a memory device according to example embodiments.

Referring to FIG. 12, a memory device 200 includes a control logic circuit 210, a refresh control circuit 215, an address register 220, a bank control logic circuit 230, a row address multiplexer 240, a column address latch 250, a row decoder, a column decoder, a memory cell array, a sense amplifier unit, an input/output (I/O) gating circuit 290, a data I/O buffer 295, an on-die termination (ODT) circuit 297 and a data I/O pad 299. A person of ordinary skill in the art should understand and appreciate that the inventive concept is not limited to the quantities of components shown and described in FIG. 12.

In some example embodiments, the memory device 200 may be a volatile memory device. For example, the memory device 200 may be one of various volatile memory devices such as a dynamic random access memory (DRAM), a mobile DRAM, a dual data rate (DDR) DRAM, a low power DDR (LPDDR) DRAM, a graphic DDR (GDDR) DRAM, or the like.

The memory cell array includes a plurality of memory cells. The memory cell array may include a plurality of bank arrays, e.g., first through fourth bank arrays 280*a*, 280*b*, 280*c* and 280*d*. The row decoder may include a plurality of bank row decoders, e.g., first through fourth bank row decoders 260*a*, 260*b*, 260*c* and 260*d* connected to the first through fourth bank arrays 280*a*, 280*b*, 280*c* and 280*d*, respectively. The column decoder may include a plurality of bank column decoders, e.g., first through fourth bank column decoders 270*a*, 270*b*, 270*c* and 270*d* connected to the first through fourth bank arrays 280*a*, 280*b*, 280*c* and 280*d*, respectively. The sense amplifier unit may include a plurality of bank sense amplifiers, e.g., first through fourth bank sense amplifiers 285*a*, 285*b*, 285*c* and 285*d* connected to the first through fourth bank arrays 280*a*, 280*b*, 280*c* and 280*d*, respectively.

The first through fourth bank arrays 280*a* through 280*d*, the first through fourth bank row decoders 260*a* through 260*d*, the first through fourth bank column decoders 270*a* through 270*d*, and the first through fourth bank sense amplifiers 285*a* through 285*d* may form first through fourth banks, respectively. For example, the first bank array 280*a*, the first bank row decoder 260*a*, the first bank column decoder 270*a*, and the first bank sense amplifier 285*a* may form the first bank; the second bank array 280*b*, the second bank row decoder 260*b*, the second bank column decoder 270*b*, and the second bank sense amplifier 285*b* may form the second bank; the third bank array 280*c*, the third bank row decoder 260*c*, the third bank column decoder 270*c*, and the third bank sense amplifier 285*c* may form the third bank; and the fourth bank array 280*d*, the fourth bank row decoder 260*d*, the fourth bank column decoder 270*d*, and the fourth bank sense amplifier 285*d* may form the fourth bank. Although FIG. 12 illustrates the memory device 200 including four banks, in other example embodiments, the memory device 200 may include any number of banks. Nor is there a requirement that the components shown in FIG. 12 in quantities of four have a one-to-one correspondence with each other. In other words, there could be more or less decoders or sensors than shown.

Figure 16:
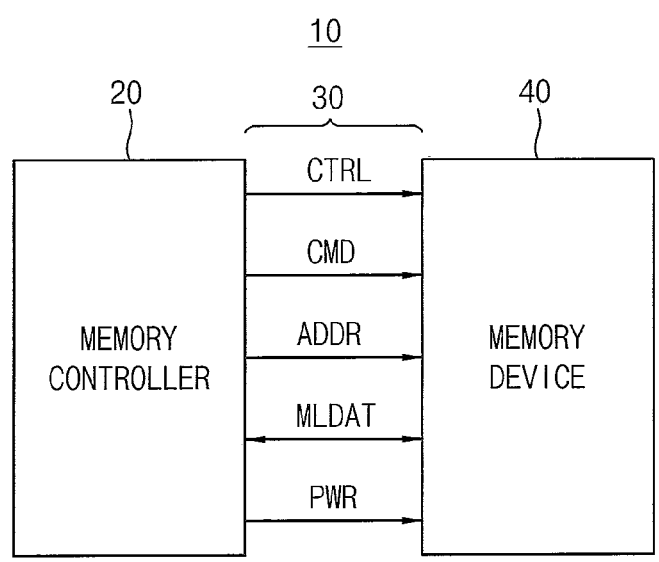
FIG. 16 is a block diagram illustrating a memory system according to example embodiments.

The address register 220 may receive an address ADDR including a bank address BANK_ADDR, a row address ROW_ADDR and a column address COL_ADDR from a memory controller (e.g., a memory controller 20 in FIG. 16). The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to receipt of the bank address BANK_ADDR. One of the first through fourth bank row decoders 260a through 260d corresponding to the received bank address BANK_ADDR may be activated in response to the bank control signals generated by the bank control logic circuit 230, and one of the first through fourth bank column decoders 270a through 270d corresponding to the received bank address BANK_ADDR may be activated in response to the bank control signals generated by the bank control logic circuit 230.

The refresh control circuit 215 may generate a refresh address REF_ADDR in response to receipt of a refresh command or entrance of any self refresh mode. For example, the refresh control circuit 215 may include a refresh counter that is configured to sequentially change the refresh address REF_ADDR from a first address of the memory cell array to a last address of the memory cell array. The refresh control circuit 215 may receive control signals from the control logic circuit 210.

The row address multiplexer 240 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to the first through fourth bank row decoders 260a through 260d.

The activated one of the first through fourth bank row decoders 260a through 260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. In example embodiments, in a burst mode, the column address latch 250 may generate column address COL_ADDR' that increment from the received column address COL_ADDR. The column address latch 250 may apply the temporarily stored column address COL_ADDR or generated column address COL_ADDR' to the first through fourth bank column decoders 270a through 270d.

The activated one of the first through fourth bank column decoders 270a through 270d may decode the column address COL_ADDR or COL_ADDR' output from the column address latch 250, and may control the I/O gating circuit 290 to output data corresponding to the column address COL_ADDR.

The I/O gating circuit 290 may include a circuitry for gating I/O data. For example, although not shown, the I/O gating circuit 290 may include an input data mask logic, read data latches for storing data output from the first through fourth bank arrays 280a through 280d, and write drivers for writing data to the first through fourth bank arrays 280a through 280d.

Data DQ to be read from one of the first through fourth bank arrays 280a through 280d may be sensed by a sense amplifier coupled to the one bank array, and may be stored in the read data latches. The data DQ stored in the read data latches may be provided to the memory controller via the data I/O buffer 295 and the data I/O pad 299. Data DQ received via the data I/O pad 299 that are to be written to one of the first through fourth bank arrays 280a-280d may be provided from the memory controller to the data I/O buffer 295. The data DQ received via the data I/O pad 299 and provided to the data I/O buffer 295 may be written to the one bank array via the write drivers in the I/O gating circuit 290.

The control logic circuit 210 may control an operation of the memory device 200. For example, the control logic circuit 210 may generate control signals for the memory device 200 to perform a data write operation or a data read operation. The control logic circuit 210 may include a command decoder 211 that decodes a command CMD received from the memory controller and a mode register 212 that sets an operation mode of the memory device 200. For example, the command decoder 211 may generate the control signals corresponding to the command CMD by decoding a write enable signal (e.g., /WE), a row address strobe signal (e.g., /RAS), a column address strobe signal (e.g., /CAS), a chip select signal (e.g., /CS), etc. The control logic circuit 210 may further receive a clock signal (e.g., CLK) and a clock enable signal (e.g., /CKE) for operating the memory device 200 in a synchronous manner.

The multi-level signal generator according to example embodiments (e.g., the multi-level signal generator 1000 of FIG. 1 and the first multi-level signal generator 2100 in FIG. 9) and the multi-level signal receiver (e.g., the first multi-level signal receiver 2300 in FIG. 9) may be included in the data I/O buffer 295. The command decoder (e.g., the command decoder 2400 in FIG. 9) may correspond to the command decoder 211.

The ODT circuit 297 may be connected to the data I/O pad 299 and the data I/O buffer 295. When the ODT circuit 297 is enabled, an ODT operation may be performed. The ODT operation may reduce (and/or prevent) a signal from being reflected by using a termination resistor so as to improve signal integrity.

Although the memory device according to example embodiments is described based on a DRAM, the memory device according to example embodiments may be any volatile memory device, and/or any nonvolatile memory device, e.g., a flash memory, a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 13:
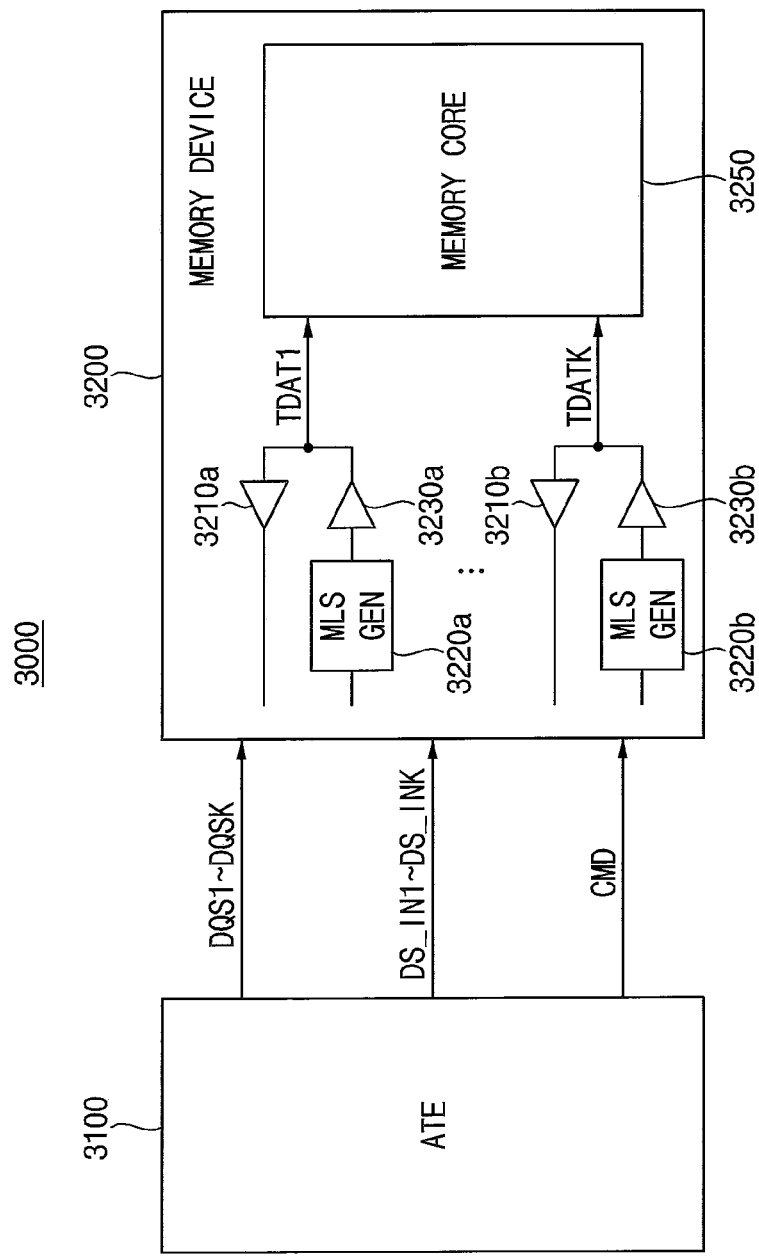
FIGS. 13 and 14 are block diagrams illustrating a test system according to example embodiments.
Figure 14:
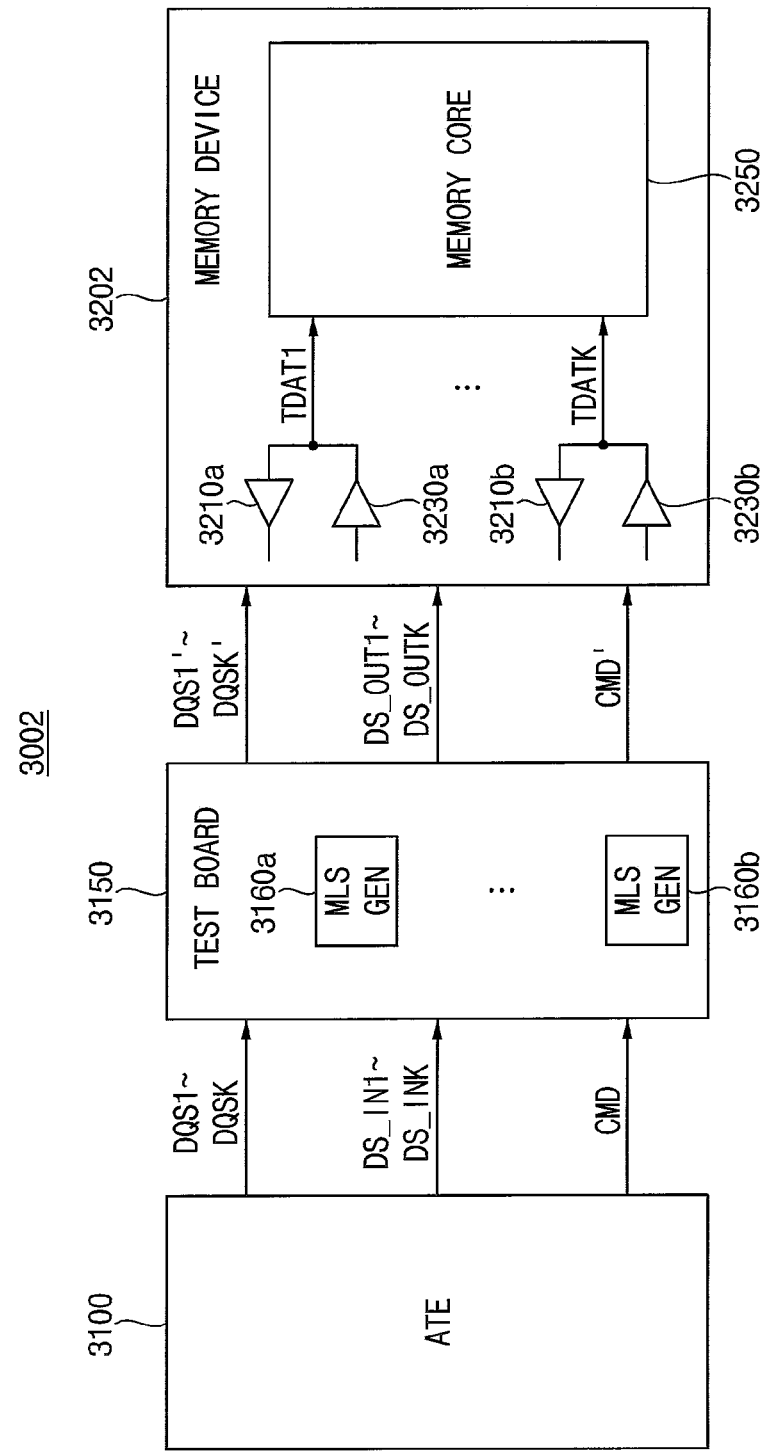

FIGS. 13 and 14 are block diagrams illustrating a test system according to example embodiments.

Referring to FIG. 13, a test system 3000 includes a test equipment 3100 and a memory device 3200.

The test equipment 3100 generates a plurality of data strobe signals DQS1 through DQSK, a plurality of input data signals DS_IN1 through DS_INK and a command signal CMD.

For example, the number of the data strobe signals DQS1 through DQSK and the number of the input data signals DS_IN1 through DS_INK may be K, where K is a natural number greater than or equal to two. The plurality of input data signals DS_IN1 through DS_INK may be two-level signals, and the test equipment 3100 may be an existing or conventional test equipment that generates two-level signals. For example, the test equipment 3100 may be an automated test equipment (ATE).

The plurality of data strobe signals DQS1 through DQSK, the plurality of input data signals DS_IN1 through DS_INK and the command signal CMD may correspond to the clock signal CK, the input data signal DS_IN and the command signal CMD in FIG. 1, respectively. The plurality of input data signals DS_IN1 through DS_INK may correspond to test data provided from the test equipment 3100.

The memory device 3200 may include a plurality of transmitters 3210*a* and 3210*b*, a plurality of receivers 3230*a* and 3230*b*, a plurality of multi-level signal generators (MLS GEN) 3220*a* and 3220*b* and a memory core 3250. For example, the number of the transmitters 3210*a* and 3210*b*, the number of the receivers 3230*a* and 3230*b* and the number of the multi-level signal generators 3220*a* and 3220*b* may be K, where K is a natural number greater than or equal to two. The memory device 3200 may operate based on the multi-level signaling scheme that transmits and receives multi-level signals.

The plurality of transmitters 3210*a* and 3210*b* may output or generate multi-level signals. The plurality of multi-level signal generators 3220*a* and 3220*b* may generate a plurality of output data signals that are multi-level signals based on the plurality of input data signals DS_IN1 through DS_INK that are two-level signals. The plurality of receivers 3230*a* and 3230*b* may receive multi-level signals, and may generate a plurality of test data TDAT1 through TDATK that correspond to the test data provided from the test equipment 3100 based on the plurality of output data signals that are multi-level signals. The memory core 3250 may store the plurality of test data TDAT1 through TDATK. For example, the plurality of test data TDAT1 through TDATK may be provided to the memory core 3250 as write data. For example, the memory core 3250 may include the memory cell array and the sense amplifier unit in FIG. 12.

According to example embodiments, the memory device 3200 may be one of the memory devices 2000, 2000*a*, 2002, and 200 described in FIGS. 9 through 12, and each of the plurality of multi-level signal generators 3220*a* and 3220*b* may be one of the multi-level signal generators 1000, 1000*a*, 2100, 2100*a*, and 2100 described in FIGS. 1, 3, and 9 to 11, respectively.

Although FIG. 13 illustrates that the test equipment 3100 tests or inspects one memory device 3200, example embodiments are not limited thereto. For example, the test equipment 3100 may simultaneously test a plurality of memory devices.

In some example embodiments, the memory device 3200 may generate a plurality of test result signals that correspond to the plurality of test data TDAT1 through TDATK, and may provide the plurality of test result signals to the test equipment 3100. Thus, although not illustrated in FIG. 13, the memory device 3200 may further include a configuration for generating the plurality of test result signals that are two-level signals based on multi-bit data.

The test system 3000 according to example embodiments may test, using the test equipment 3100 that generates the two-level signals, the memory device 3200 that operates based on the multi-level signaling scheme, and thus the test operation may be performed with a relatively low cost.

Referring to FIG. 14, a test system 3002 includes a test equipment 3100, a test board 3150 and a memory device 3202. The descriptions repeated with FIG. 13 will be omitted.

The test system 3002 may be the same as the test system 3000 of FIG. 13, except that a plurality of multi-level signal generators 3160*a* and 3160*b* are included in the test board 3150 other than the memory device 3202.

The test board 3150 may include the plurality of multi-level signal generators 3160*a* and 3160*b*. The test board 3150 may provide a plurality of data strobe signals DQS1' through DQSK', the plurality of output data signals DS_OUT1 through DS_OUTK and a command signal CMD' based on the plurality of data strobe signals DQS1 through DQSK, the plurality of input data signals DS_IN1 through DS_INK and the command signal CMD.

The plurality of multi-level signal generators 3160*a* and 3160*b* may be the multi-level signal generators according to example embodiments, and may be the same as the plurality of multi-level signal generators 3220*a* and 3220*b* in FIG. 13. The plurality of multi-level signal generators 3160*a* and 3160*b* may generate the plurality of output data signals DS_OUT1 through DS_OUTK that are multi-level signals based on the plurality of input data signals DS_IN1 through DS_INK that are two-level signals.

The memory device 3202 may operate based on the multi-level signaling scheme that transmits and receives multi-level signals. The memory device 3202 may be mounted on the test board 3150 for testing or may be directly connected to the test board 3150 for testing.

The test system 3002 according to example embodiments may be implemented by adding the test board 3150 that includes the multi-level signal generators 3160*a* and 3160*b* without changing the test equipment 3100 and the memory device 3202. The test system 3002 may test, using the test equipment 3100 that generates the two-level signals, the memory device 3202 that operates based on the multi-level signaling scheme, and thus the test operation may be performed with a relatively low cost.

Figure 15:
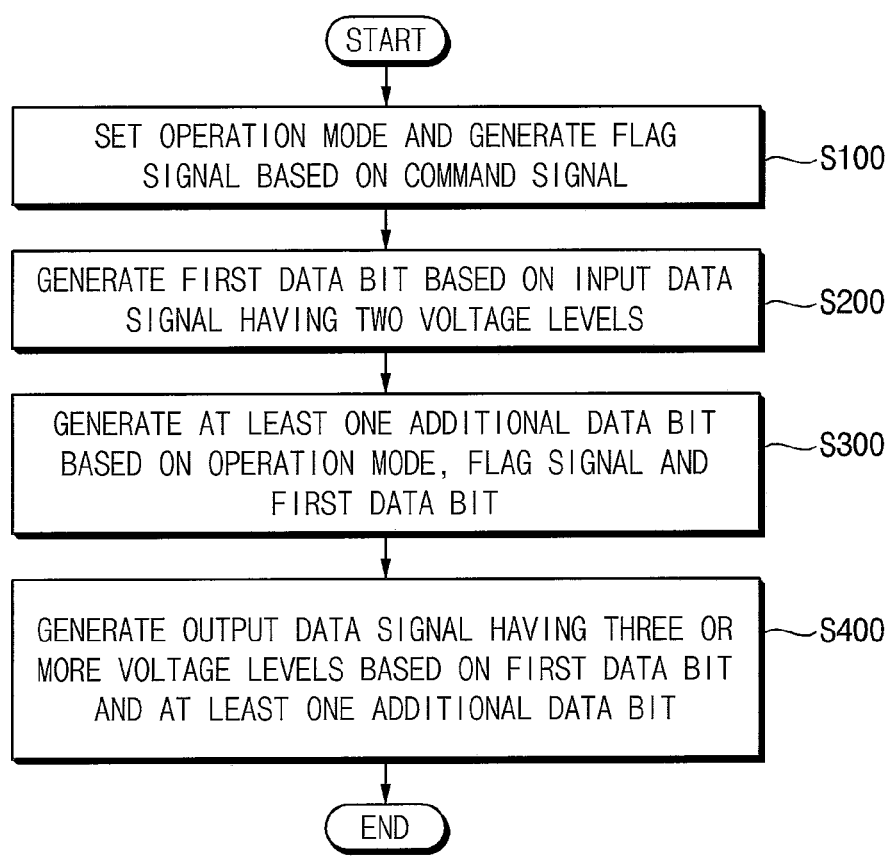
FIG. 15 is a flowchart illustrating a method of generating a multi-level signal according to example embodiments.

FIG. 15 is a flowchart illustrating a method of generating a multi-level signal according to example embodiments.

Referring to FIGS. 1 and 15, in a method of generating a multi-level signal according to example embodiments, the operation mode is set and the flag signal FLG is generated based on the command signal CMD (step S100). For example, the operation mode may be set to the test mode based on the mode setting command, and the test mode may be set to one of the first, second, and third operation modes. For example, the flag signal FLG for receiving the input data signal DS_IN corresponding to the test data and generating the output data signal DS_OUT may be generated based on the write command.

The first data bit DB is generated based on the input data signal DS_IN having two voltage levels that are different from each other (step S200). The at least one additional data bit ADB is generated based on the operation mode, the flag signal FLG and the first data bit DB (step S300). The output data signal DS_OUT is generated based on the first data bit DB and the at least one additional data bit ADB (step S400). The output data signal DS_OUT is a multi-level signal having three or more voltage levels that are different from each other.

Step S100 may be performed by the setting circuit 1200, step S200 may be performed by the receiving circuit 1100, step S300 may be performed by the data bit generating circuit 1300, and step S400 may be performed by the d digital-to-analog converter 1400.

FIG. 16 is a block diagram illustrating a memory system according to example embodiments.

Referring to FIG. 16, a memory system 10 includes a memory controller 20 and a memory device 40. The memory system 10 may further include a plurality of signal lines 30 that electrically connect the memory controller 20 with the memory device 40.

The memory device 40 is controlled by the memory controller 20. For example, based on requests from a host (not illustrated), the memory controller 20 may store (e.g., write or program) data into the memory device 40, or may retrieve (e.g., read or sense) data from the memory device 40. According to example embodiments, the memory device 40 may be one of the memory devices 2000, 2000a, 2002, 200, 3200, and 3202 described in FIGS. 9 through 14, respectively, and may include a multi-level signal generator. The multi-level signal generator of the memory device 40 may be one of the multi-level signal generators 1000, 1000a, 2100, 2100a, 2100, 3220a and 3220b, and 3160a and 3160b described in FIGS. 1, 3, 9 to 11, 13, and 14, respectively.

The plurality of signal lines 30 may include control lines, command lines, address lines, data input/output (I/O) lines and power lines. The memory controller 20 may transmit a command CMD, an address ADDR and a control signal CTRL to the memory device 40 via the command lines, the address lines and the control lines, may exchange a data signal MLDAT with the memory device 40 via the data I/O lines, and may transmit a power supply voltage PWR to the memory device 40 via the power lines. For example, the data signal MLDAT may be the multi-level signal. Although not illustrated in FIG. 16, the plurality of signal lines 30 may further include data strobe signal (DQS) lines for transmitting a DQS signal.

In some example embodiments, at least a part or all of the signal lines 30 may be referred to as a channel. The term "channel" as used herein may represent signal lines that include the data I/O lines for transmitting the data signal MLDAT. However, example embodiments are not limited thereto, and the channel may further include the command lines for transmitting the command CMD and/or the address lines for transmitting the address ADDR.

Figure 17:
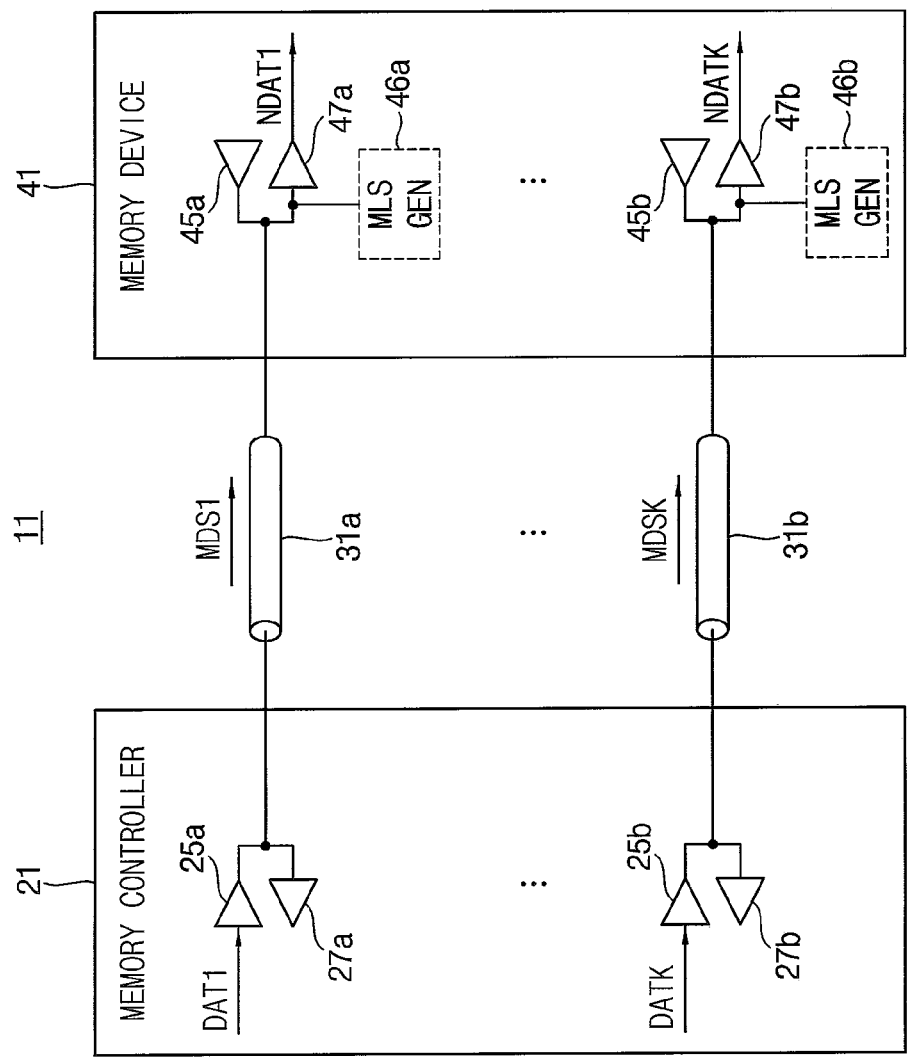
FIG. 17 is a block diagram illustrating an example of a memory system of FIG. 16 according to a certain embodiment.

FIG. 17 is a block diagram illustrating an example of a memory system of FIG. 16 according to a certain embodiment.

Referring to FIG. 17, a memory system 11 includes a memory controller 21, a memory device 41 and a plurality of channels 31a and 31b. For example, the number of the channels 31a and 31b may be K, where K is a natural number greater than or equal to two.

The memory controller 21 may include a plurality of transmitters 25a and 25b, and a plurality of receivers 27a and 27b. The memory device 41 may include a plurality of transmitters 45a and 45b, a plurality of receivers 47a and 47b, and a plurality of multi-level signal generators 46a and 46b. According to example embodiments, the memory device 41 may be one of the memory devices 2000, 2000a, 2002, 200, 3200, 3202, and 40 described in FIGS. 9 to 14 and 16, respectively.

Each of the plurality of transmitters 25a, 25b, 45a and 45b may output or generate the multi-level signal. Each of the plurality of receivers 27a, 27b, 47a and 47b may receive the multi-level signal. According to example embodiments, each of the plurality of multi-level signal generators 46a and 46b may be one of the multi-level signal generators 1000, 1000a, 2100, 2100a, 2100, 3220a and 3220b, and 3160a and 3160b described in FIGS. 1, 3, 9 to 11, 13, and 14, respectively.

The plurality of channels 31a and 31b may connect the memory controller 21 to the memory device 41. Each of the plurality of channels 31a and 31b may be connected to a respective one of the plurality of transmitters 25a and 25b and a respective one of the plurality of receivers 27a and 27b. In addition, each of the plurality of channels 31a and 31b may be connected to a respective one of the plurality of transmitters 45a and 45b and a respective one of the plurality of receivers 47a and 47b. The multi-level signal may be transmitted through each of the plurality of channels 31a and 31b.

FIG. 17 illustrates an operation of transferring data from the memory controller 21 to the memory device 41. For example, the transmitter 25a may generate a data signal MDS1, which is the multi-level signal, based on data DAT1, the data signal MDS1 may be transmitted from the memory controller 21 to the memory device 41 through the channel 31a, and the receiver 47a may receive the data signal MDS1 to obtain data NDAT1 corresponding to the data DAT1. Similarly, the transmitter 25b may generate a data signal MDSK, which is the multi-level signal, based on input data DATK, the data signal MDSK may be transmitted to the memory device 41 through the channel 31b, and the receiver 47b may receive the data signal MDSK to obtain data NDATK corresponding to the data DATK. For example, the data NDAT1 and NDATK may be write data to be written into the memory device 41. FIG. 17 illustrates an operation in the normal mode, and the multi-level signal generators 46a and 46b and signal paths including the multi-level signal generators 46a and 46b may be disabled.

Figure 18:
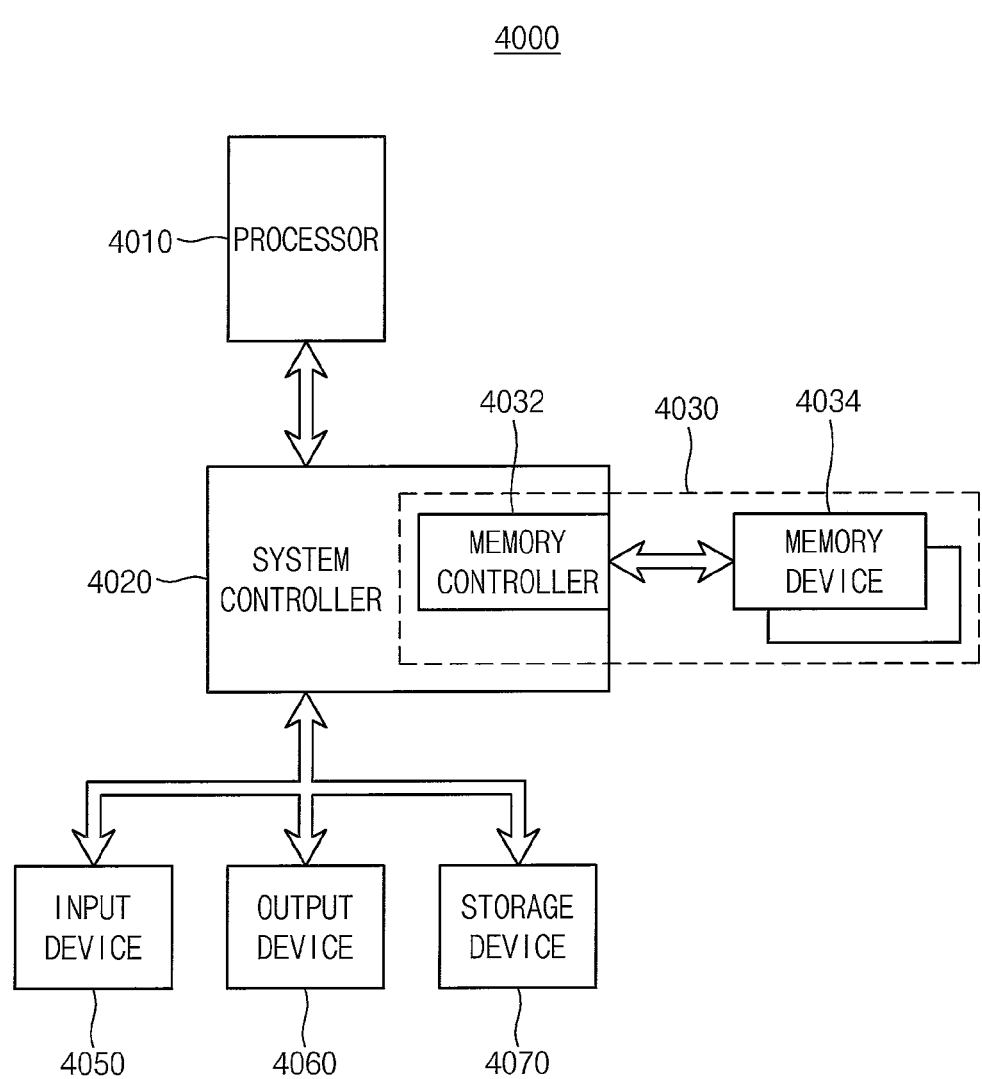
FIG. 18 is a block diagram illustrating a computing system according to example embodiments.

FIG. 18 is a block diagram illustrating a computing system according to example embodiments.

Referring to FIG. 18, a computing system 4000 includes a processor 4010, a system controller 4020 and a memory system 4030. The computing system 4000 may further include an input device 4050, an output device 4060 and a storage device 4070.

The memory system 4030 includes a plurality of memory devices 4034, and a memory controller 4032 for controlling the memory devices 4034. The memory controller 4032 may be included in the system controller 4020. The memory system 4030 may be one of the memory systems 10 and 11 described in FIGS. 16 and 17 according to example embodiments. According to example embodiments, each of the plurality of memory devices 4034 may be one of the memory devices 2000, 2000a, 2002, 200, 3200, 3202, 40, and 41 described in FIGS. 9 through 14, 16, and 17, respectively, and may include a multi-level signal generator. According to example embodiments, the multi-level signal generator of each of the memory devices 4034 may be one of the multi-level signal generators 1000, 1000a, 2100, 2100a, 2100, 3220a and 3220b, 3160a and 3160b, and 46a and 46b described in FIGS. 1, 3, 9 to 11, 13, 14, and 17, respectively.

The processor 4010 may perform various computing functions, such as executing specific software instructions for performing specific calculations or tasks. The processor 4010 may be connected to the system controller 4020 via a processor bus. The system controller 4020 may be connected to the input device 4050, the output device 4060 and the storage device 4070 via an expansion bus. As such, the processor 4010 may control the input device 4050, the output device 4060 and the storage device 4070 using the system controller 4020.

The inventive concept may be applied to various devices and systems that include the memory devices and the memory systems. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A multi-level signal generator comprising:
a receiving circuit configured to receive an input data signal from an external device and to generate a first data bit based on the input data signal having two voltage levels that are different from each other;
a setting circuit configured to receive a command signal from the external device and to generate a flag signal based on the command signal, the flag signal being changed depending on an operation mode;
a data bit generating circuit configured to:
generate a plurality of internal bits based on the first data bit,
select at least one of the plurality of internal bits based on the flag signal, and
output the selected internal bit as at least one additional data bit; and
a digital-to-analog converter configured to generate an output data signal based on the first data bit and the at least one additional data bit, the output data signal being a multi-level signal having three or more voltage levels that are different from each other,
wherein the plurality of internal bits include the first data bit.

2. The multi-level signal generator of claim 1, wherein:
the input data signal includes only information associated with the first data bit other than information associated with the at least one additional data bit, and
the data bit generating circuit is configured to generate the plurality of internal bits and the at least one additional data bit based on only the first data bit without the information associated with the at least one additional data bit.

3. The multi-level signal generator of claim 1, wherein:
the at least one additional data bit includes a second data bit,
the three or more voltage levels include a first voltage level, a second voltage level, a third voltage level and a fourth voltage level, and
the digital-to-analog converter includes a 2-bit digital-to-analog converter configured to generate the output data signal having the first, second, third and fourth voltage levels based on the first and second data bits.

4. The multi-level signal generator of claim 3, wherein the data bit generating circuit includes:
an internal bit generator configured to generate a first internal bit and a second internal bit that are different from each other based on the first data bit; and
a selector configured to output one of the first and second internal bits as the second data bit based on the flag signal.

5. The multi-level signal generator of claim 4, wherein:
the first internal bit is the same as the first data bit,
the second internal bit is the same as an inverted bit of the first data bit, and
the internal bit generator includes an inverter configured to invert the first data bit.

6. The multi-level signal generator of claim 5, wherein:
the flag signal is fixed at a first logic level in a first operation mode, and
the selector is configured to output the first internal bit as the second data bit based on the flag signal in the first operation mode.

7. The multi-level signal generator of claim 6, wherein:
the flag signal is fixed at a second logic level opposite to the first logic level in a second operation mode, and
the selector is configured to output the second internal bit as the second data bit based on the flag signal in the second operation mode.

8. The multi-level signal generator of claim 5, wherein:
the flag signal toggles between a first logic level and a second logic level opposite to the first logic level in a third operation mode, and
the selector is configured to output one of the first and second internal bits as the second data bit based on the flag signal in the third operation mode.

9. The multi-level signal generator of claim 3, wherein:
the first data bit is a most significant bit (MSB) for generating the output data signal, and
the second data bit is a least significant bit (LSB) for generating the output data signal.

10. The multi-level signal generator of claim 1, wherein the setting circuit includes:
a memory register sets configured to generate a first mode control signal for setting the operation mode to a test mode and a second mode control signal for generating the flag signal in the test mode based on the command signal; and
a flag generator configured to generate the flag signal based on the second mode control signal.

11. The multi-level signal generator of claim 1, wherein the receiving circuit and the digital-to-analog converter are configured to operate based on a data strobe signal.

12. A memory device comprising:
a first data input/output (I/O) pin configured to receive a first input data signal or a second input data signal depending on an operation mode of the memory device, the first input data signal having two voltage levels that are different from each other, the second input data signal being a multi-level signal having three or more voltage levels that are different from each other;
a first multi-level signal generator configured to generate a first output data signal that is the multi-level signal based on the first input data signal; and
a first multi-level signal receiver configured to receive the first output data signal or the second input data signal depending on the operation mode, and to generate first reception data including two or more data bits, wherein the first multi-level signal generator includes:

a receiving circuit configured to generate a first data bit based on the first input data signal;

a setting circuit configured to generate a flag signal based on a command signal, the flag signal being changed depending on the operation mode;

a data bit generating circuit configured to generate a plurality of internal bits based on the first data bit, to select at least one of the plurality of internal bits based on the flag signal, and to output the selected internal bit as at least one additional data bit; and a digital-to-analog converter configured to generate the first output data signal based on the first data bit and the at least one additional data bit.

13. The memory device of claim 12, further comprising:

a first signal path including the first multi-level signal generator, disposed between the first data I/O pin and the first multi-level signal receiver, and configured to receive the first input data signal and to provide the first output data signal;

a second signal path disposed between the first data I/O pin and the first multi-level signal receiver, and configured to provide the second input data signal; and a first selector configured to select one of the first and second signal paths depending on the operation mode.

14. The memory device of claim 13, wherein:

the first signal path is enabled in a test mode of the memory device in which the memory device is to be tested, and the second signal path is enabled in a normal mode in which the memory device is to be normally operated.

15. The memory device of claim 14, wherein:

the first input data signal is received from an external test equipment, and the second input data signal is received from an external memory controller.

16. The memory device of claim 12, further comprising:

a second data I/O pin configured to receive a third input data signal or a fourth input data signal depending on the operation mode, the third input data signal having the two voltage levels, the fourth input data signal being the multi-level signal having the three or more voltage levels;

a second multi-level signal generator configured to generate a second output data signal that is the multi-level signal based on the third input data signal; and a second multi-level signal receiver configured to receive the second output data signal or the fourth input data signal depending on the operation mode, and to generate second reception data including two or more data bits.

17. The memory device of claim 16, wherein the second multi-level signal generator has a structure the same as that of the first multi-level signal generator.

18. The memory device of claim 17, wherein the command signal is shared by the first and second multi-level signal generators.

19. The memory device of claim 12, wherein the memory device is a dynamic random access memory (DRAM).

20. A multi-level signal generator comprising:

a receiving circuit configured to receive an input data signal and to generate a most significant bit (MSB) based on the input data signal, the input data signal having two voltage levels that are different from each other;

a setting circuit configured to receive a command signal and to generate a flag signal based on the command signal, the flag signal having a fixed level or a variable level depending on an operation mode;

a data bit generating circuit configured to generate a first internal bit and a second internal bit that are different from each other based on the MSB, to select one of the first and second internal bits based on the flag signal, and to output the selected internal bit as a least significant bit (LSB); and a digital-to-analog converter configured to generate an output data signal based on the MSB and the LSB, the output data signal being a four-level pulse amplitude modulation (PAM4) signal having four voltage levels that are different from each other, wherein the data bit generating circuit includes:

an internal bit generator configured to output the MSB as the first internal bit, and including an inverter configured to generate the second internal bit having an inverted bit of the MSB; and a selector configured to output one of the first and second internal bits as the LSB based on the flag signal, and wherein the setting circuit includes:

a memory register sets configured to generate a first mode control signal for setting the operation mode to a test mode and a second mode control signal for generating the flag signal in the test mode based on the command signal; and a flag generator configured to generate the flag signal based on the second mode control signal.

* * * * *